US009949417B2

(12) United States Patent
Morikawa

(10) Patent No.: US 9,949,417 B2
(45) Date of Patent: Apr. 17, 2018

(54) COMPONENT SUPPLY SYSTEM

(71) Applicant: FUJI MACHINE MFG. CO., LTD., Chiryu (JP)

(72) Inventor: Shunji Morikawa, Toyoake (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/108,503

(22) PCT Filed: Dec. 27, 2013

(86) PCT No.: PCT/JP2013/085252
§ 371 (c)(1),
(2) Date: Jun. 27, 2016

(87) PCT Pub. No.: WO2015/097904
PCT Pub. Date: Jul. 2, 2015

(65) Prior Publication Data
US 2016/0330880 A1 Nov. 10, 2016

(51) Int. Cl.
*B65G 47/24* (2006.01)
*H05K 13/02* (2006.01)
(Continued)

(52) U.S. Cl.
CPC .......... *H05K 13/021* (2013.01); *B23P 19/001* (2013.01); *B65G 47/145* (2013.01); *H05K 13/028* (2013.01); *H05K 13/08* (2013.01)

(58) Field of Classification Search
CPC .. B65G 47/14–47/1492; H05K 13/021; H05K 13/028; H05K 13/08; B25J 9/1697; B25J 19/023
(Continued)

(56) References Cited

U.S. PATENT DOCUMENTS 4,909,376 A * 3/1990 Herndon ................ B25J 9/1697
198/395
5,084,959 A * 2/1992 Ando .................... H01L 21/681
29/720
(Continued)

FOREIGN PATENT DOCUMENTS

DE 101 26 188 A1 12/2002
EP 2 001 275 A1 12/2008
(Continued)

OTHER PUBLICATIONS

International Search Report dated Apr. 1, 2014 in PCT/JP2013/085252 filed Dec. 27, 2013.
(Continued)

*Primary Examiner* — William R Harp
(74) *Attorney, Agent, or Firm* — Oblon, McClelland, Maier & Neustadt, L.L.P.

(57) ABSTRACT

When a component support member is moved forward with respect to a component feeder, the component feeder is vibrated, and the components are discharged from the component feeder on a component support surface and are supported in a dispersed state. An imaging device moves in a lateral direction, images a plurality of components on the component support surface all at once, and a suction nozzle of a component holding head holds a component with a lead in a state appropriate to be held. The suction nozzle is rotated and pivoted to insert the component in a component receiving member of one of component carriers and that is positioned at a component receiving position, with the lead oriented downward. The component carrier which receives the component is moved to a component delivery position, and the component is delivered to a mounting head of an electronic circuit assembly apparatus.

11 Claims, 15 Drawing Sheets

(51) Int. Cl.
    *B65G 47/14*     (2006.01)
    *H05K 13/08*     (2006.01)
    *B23P 19/00*     (2006.01)

(58) Field of Classification Search
    USPC .......................................................... 198/396
    See application file for complete search history.

(56) References Cited

U.S. PATENT DOCUMENTS

| | | | |
|---|---|---|---|
| 5,314,055 A * | 5/1994 | Gordon | B25J 9/1697 198/395 |
| 5,687,831 A * | 11/1997 | Carlisle | A61F 11/12 198/395 |
| 6,056,108 A | 5/2000 | Buchi et al. | |
| 6,481,560 B2 * | 11/2002 | Kearney | B65G 47/1478 198/396 |
| 8,550,233 B2 * | 10/2013 | Perroud | B65G 27/34 198/502.2 |
| 2012/0261232 A1 | 10/2012 | Nakajima et al. | |
| 2012/0266720 A1 * | 10/2012 | Oka | B25J 17/0283 74/665 H |

FOREIGN PATENT DOCUMENTS

| | | |
|---|---|---|
| FR | 2 944 001 A1 | 10/2010 |
| JP | 6-127698 A | 5/1994 |
| JP | 7-68426 A | 3/1995 |
| JP | 8-282851 A | 10/1996 |
| JP | 10-202569 A | 8/1998 |
| JP | 11-180538 A | 7/1999 |
| JP | 2012-218930 A | 11/2012 |
| JP | 2012-245602 A | 12/2012 |
| WO | 2013/002099 A1 | 1/2013 |

OTHER PUBLICATIONS

Extended European Search Report dated Nov. 24, 2016 in Patent Application No. 13900204.2.

* cited by examiner

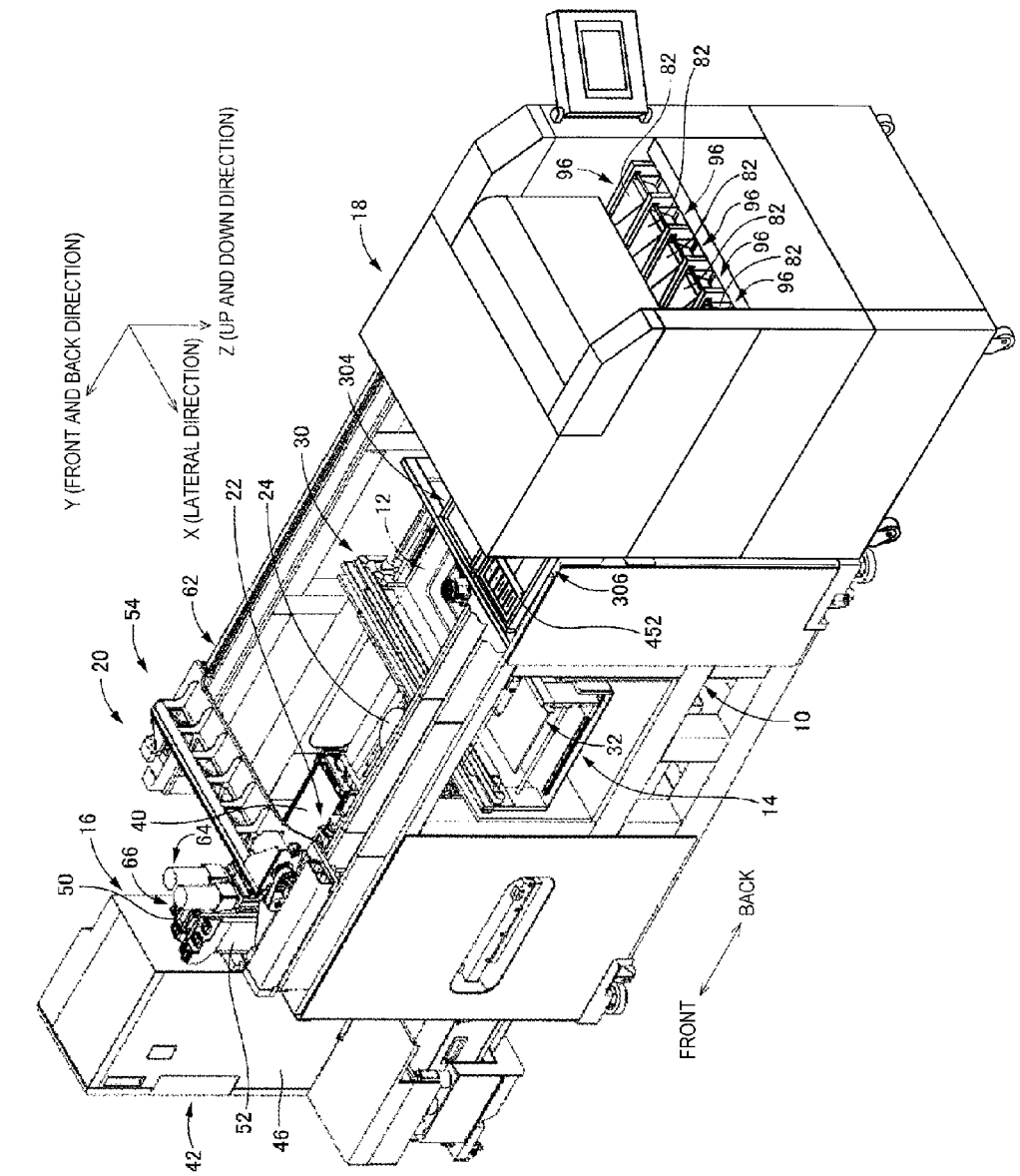
[FIG. 1]

[FIG. 2]
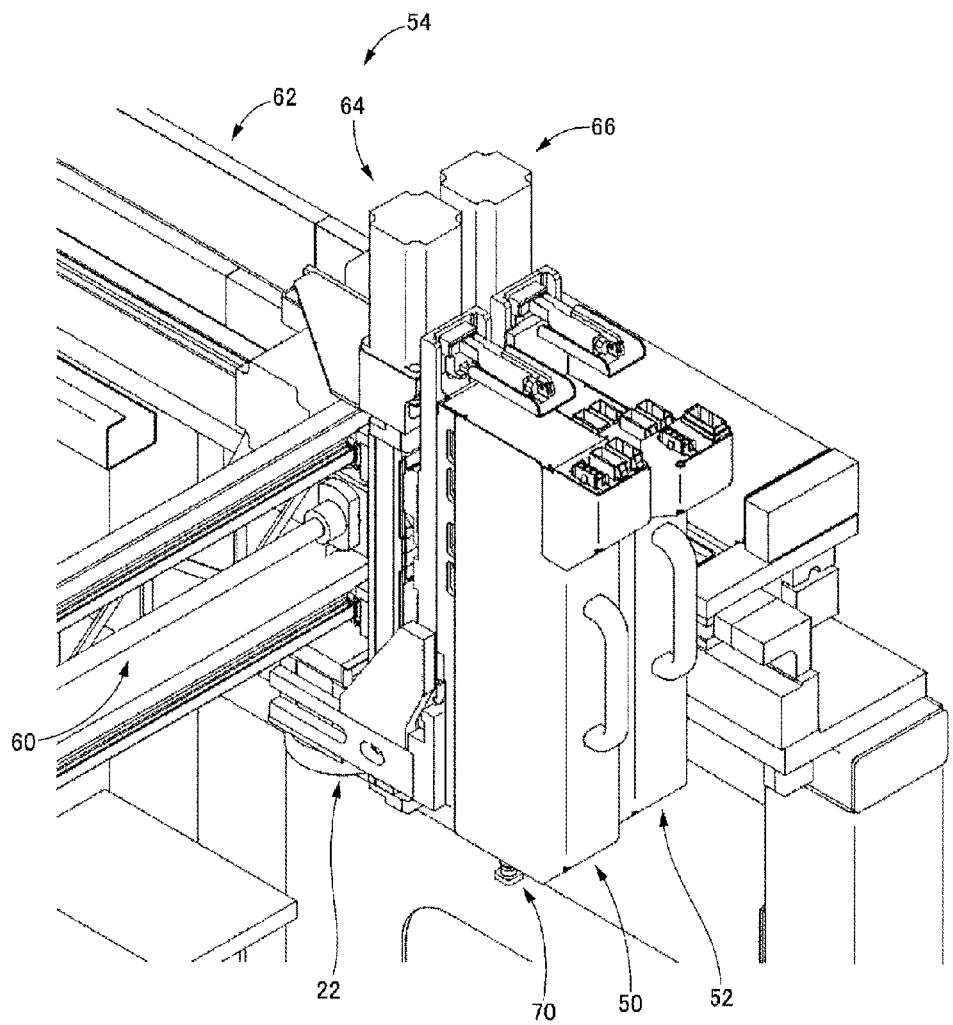

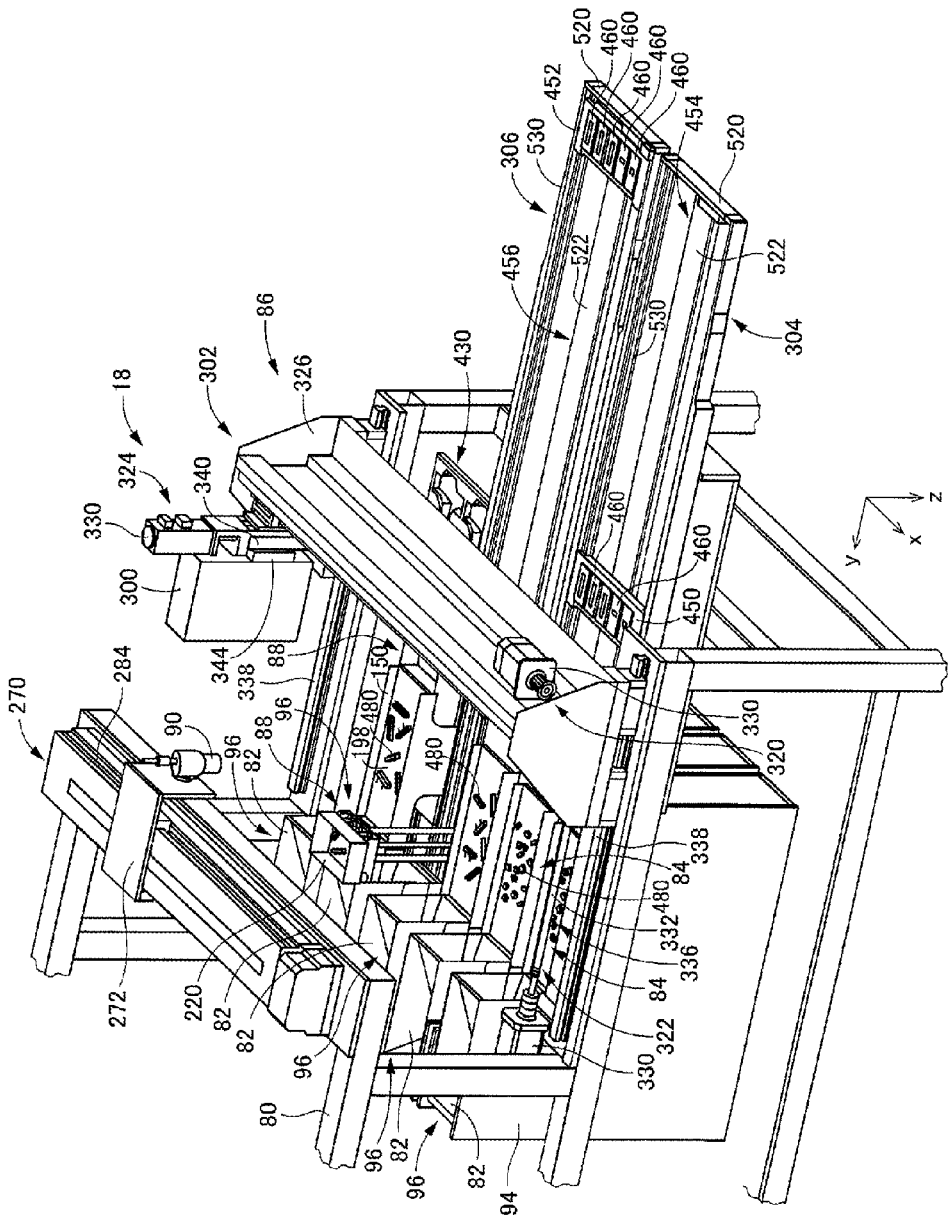
[FIG. 3]

[FIG. 4]
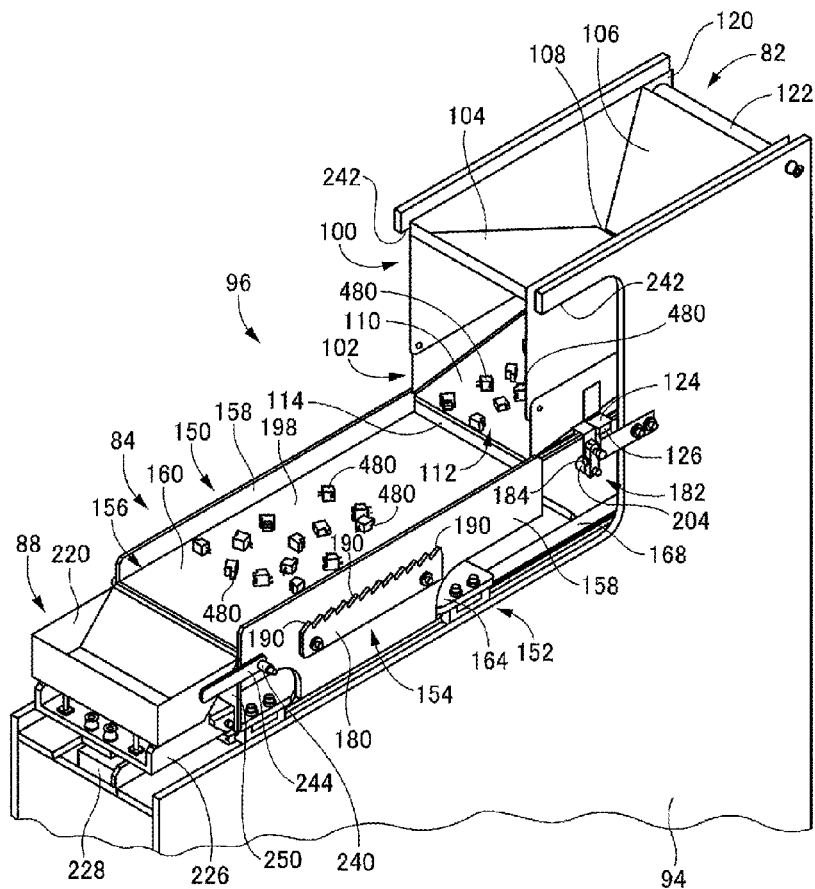
[FIG. 5]
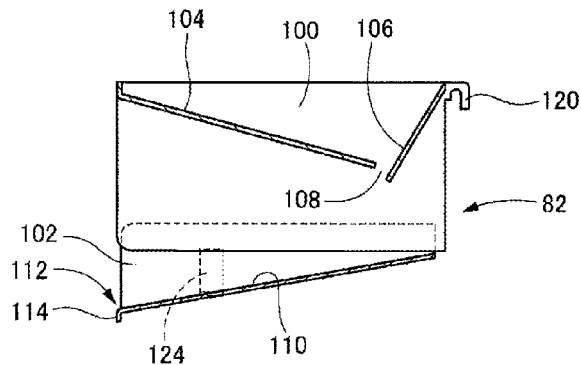

[FIG. 6]
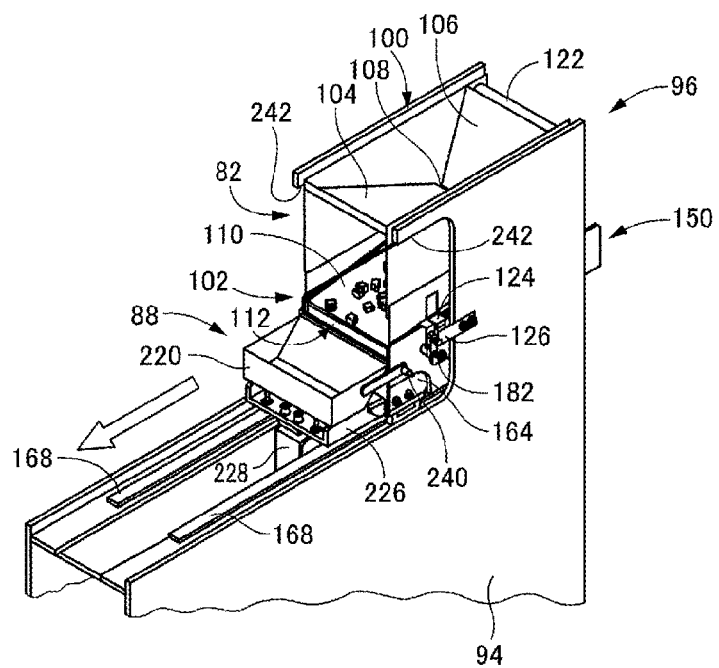
[FIG. 7]
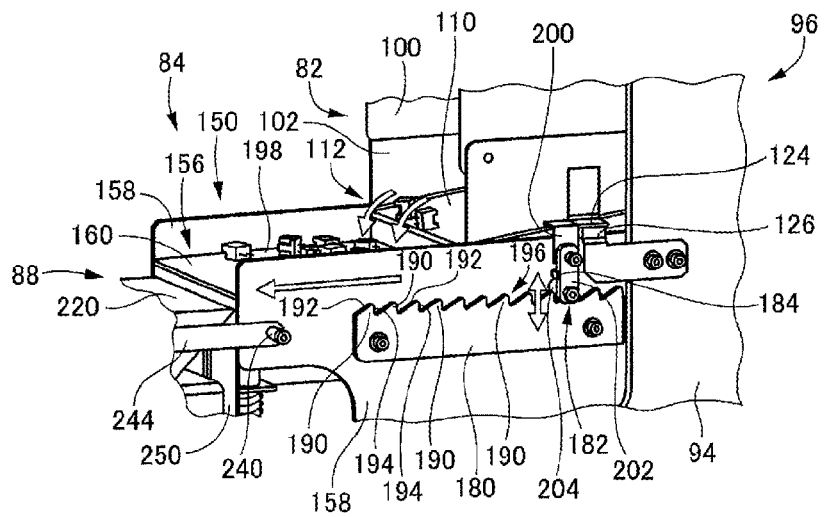

[FIG. 8]
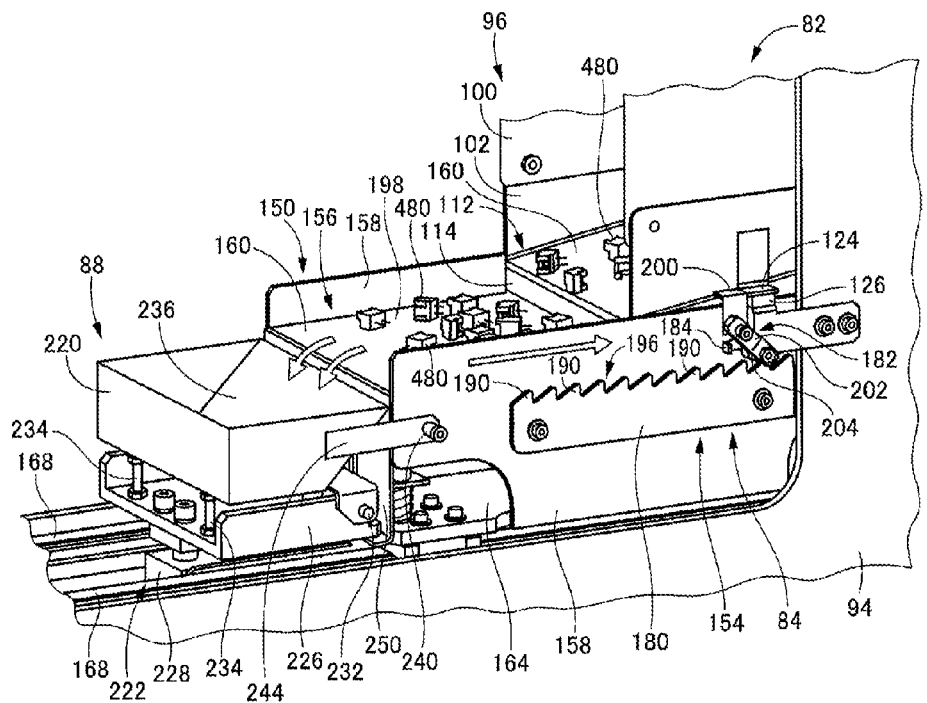
[FIG. 9]
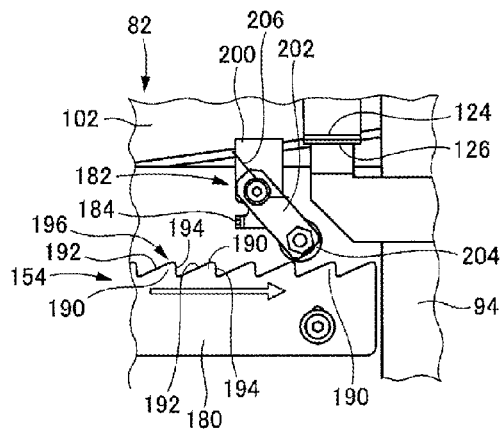

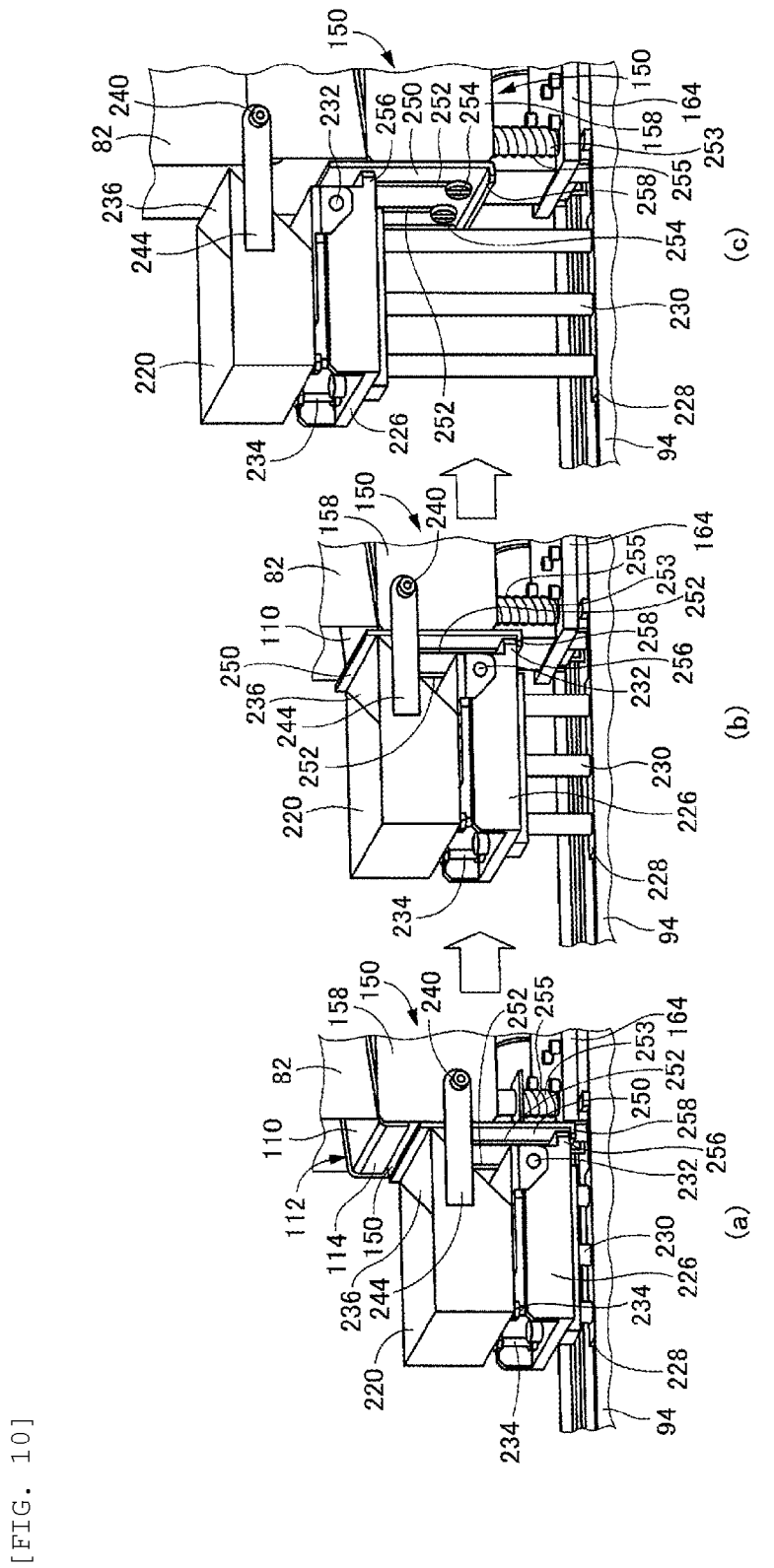
[FIG. 10]

[FIG. 11]
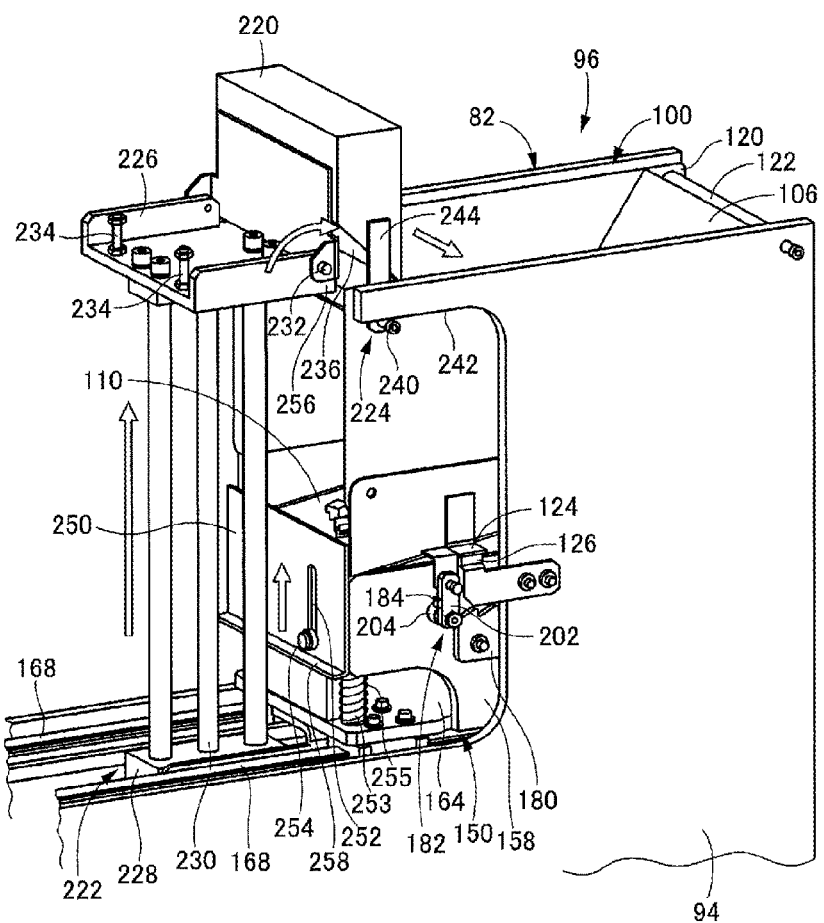

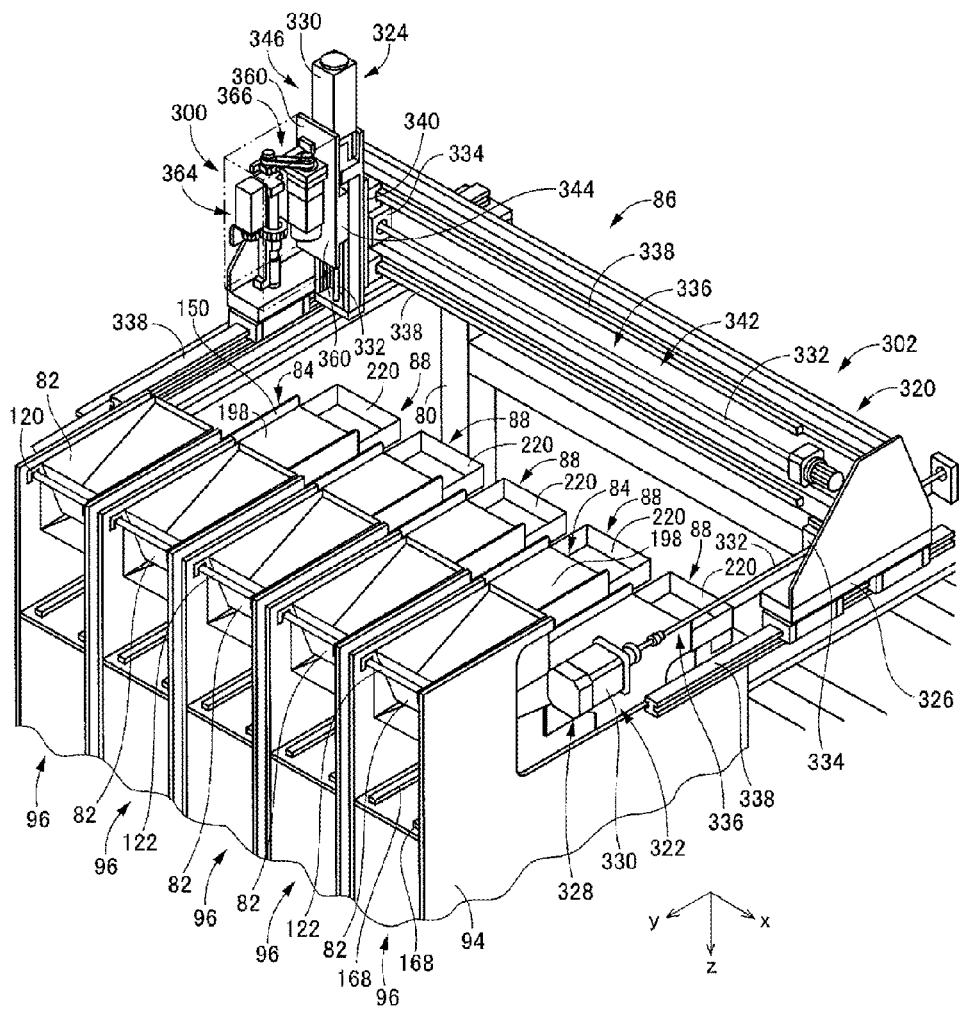
[FIG. 12]

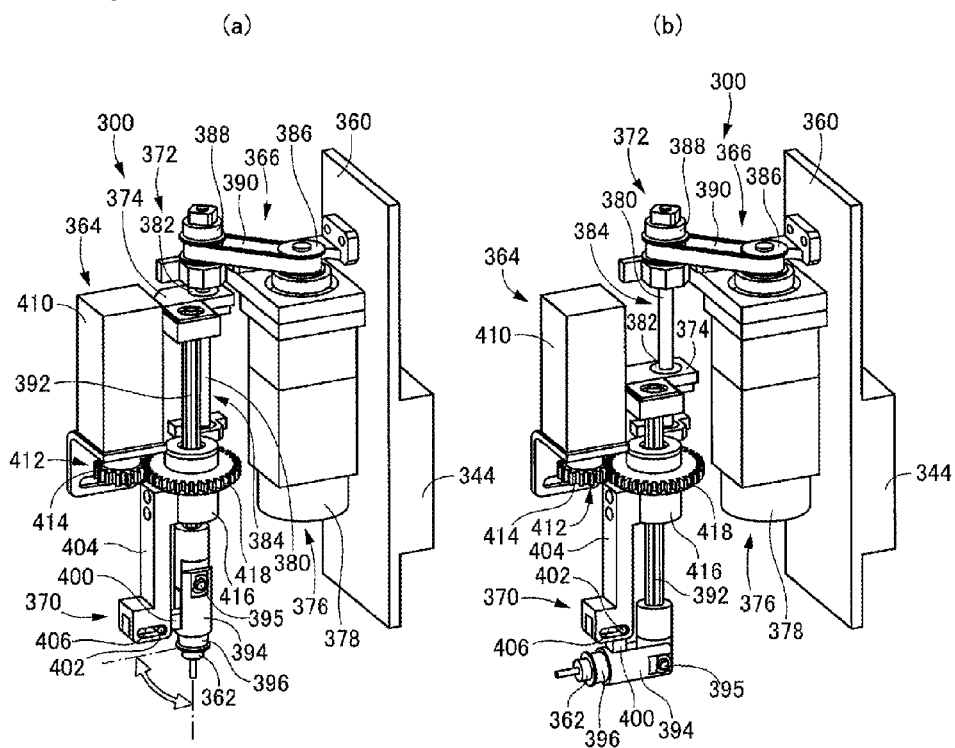
[FIG. 13]
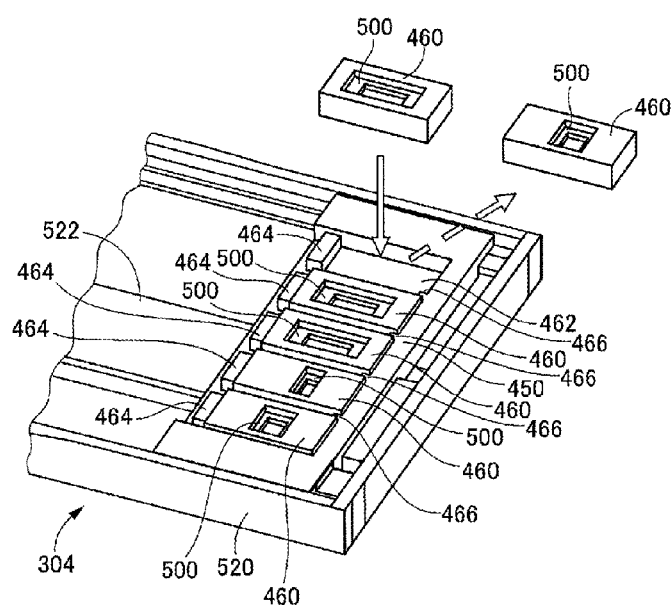
[FIG. 14]

[FIG. 15]
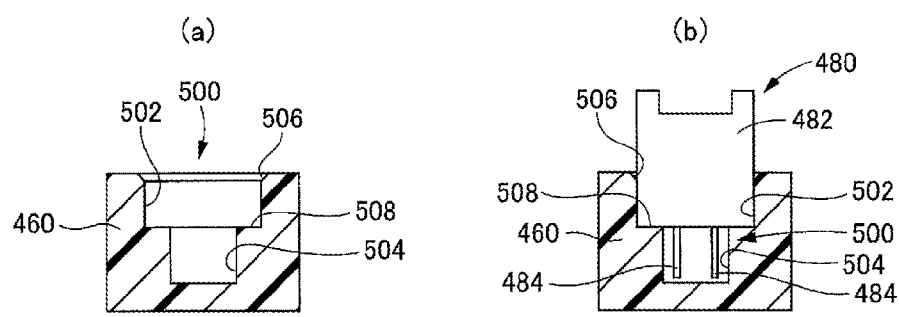
[FIG. 16]
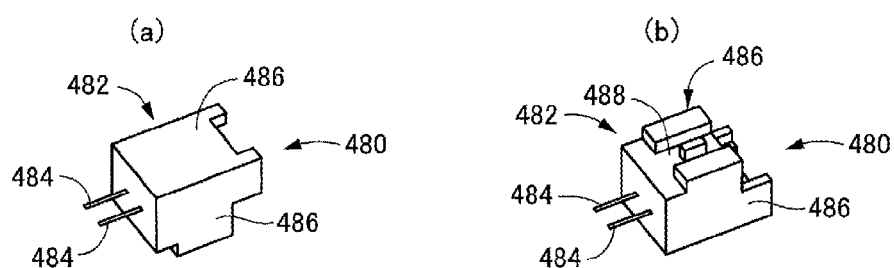

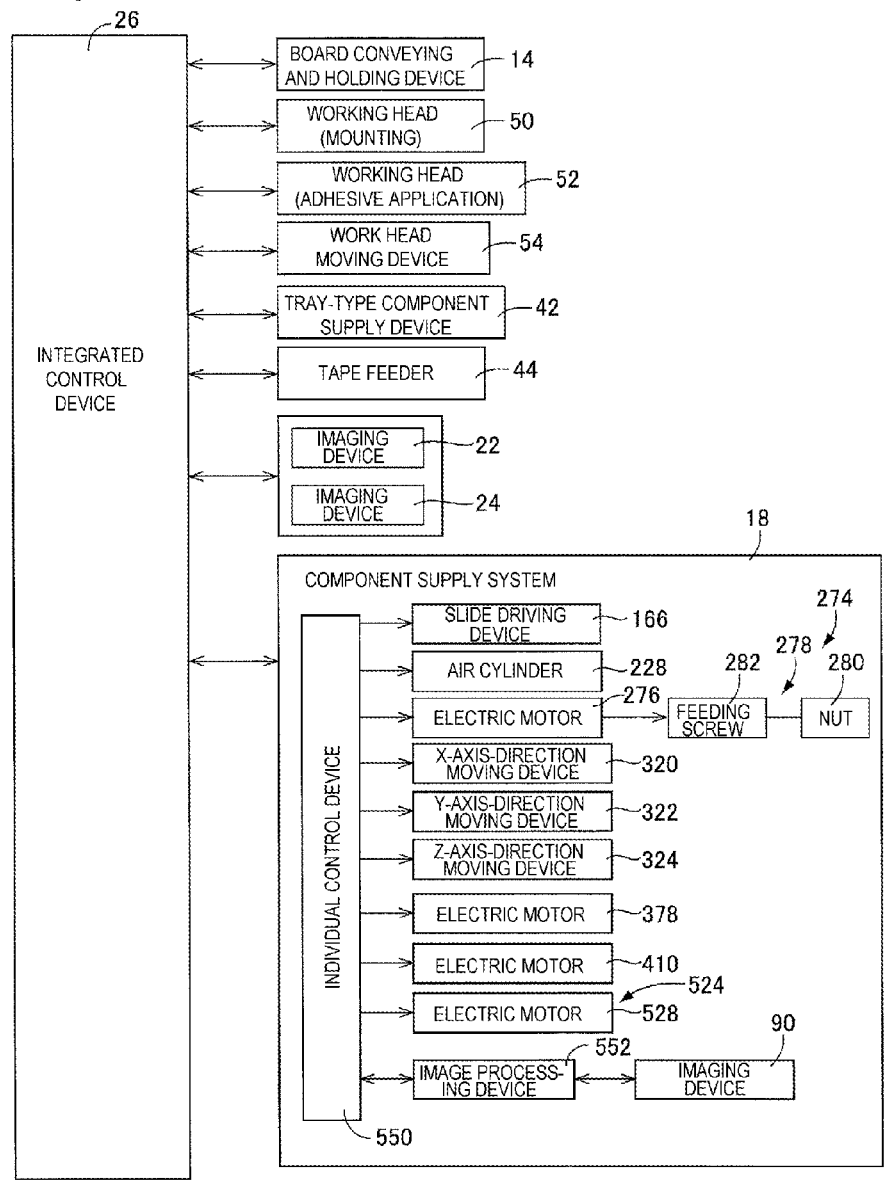
[FIG. 17]

[FIG. 18]
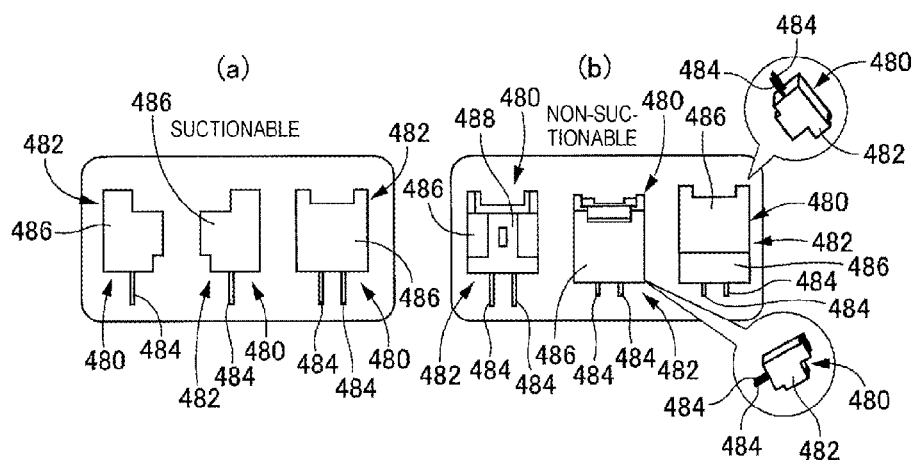
[FIG. 19]
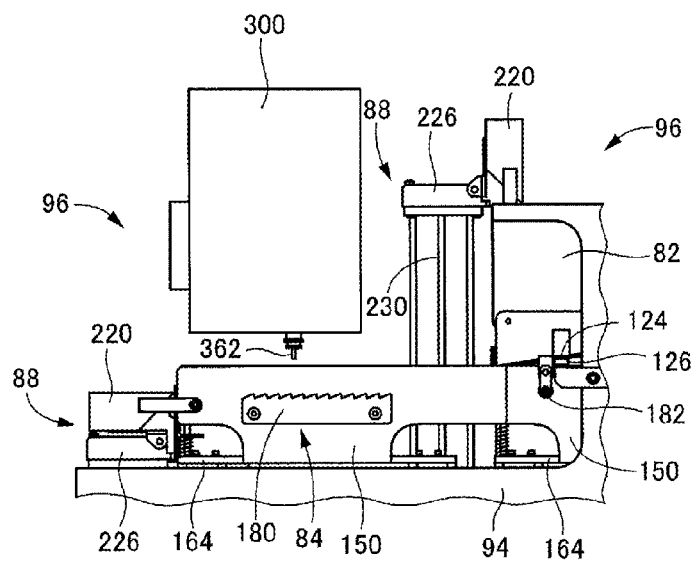

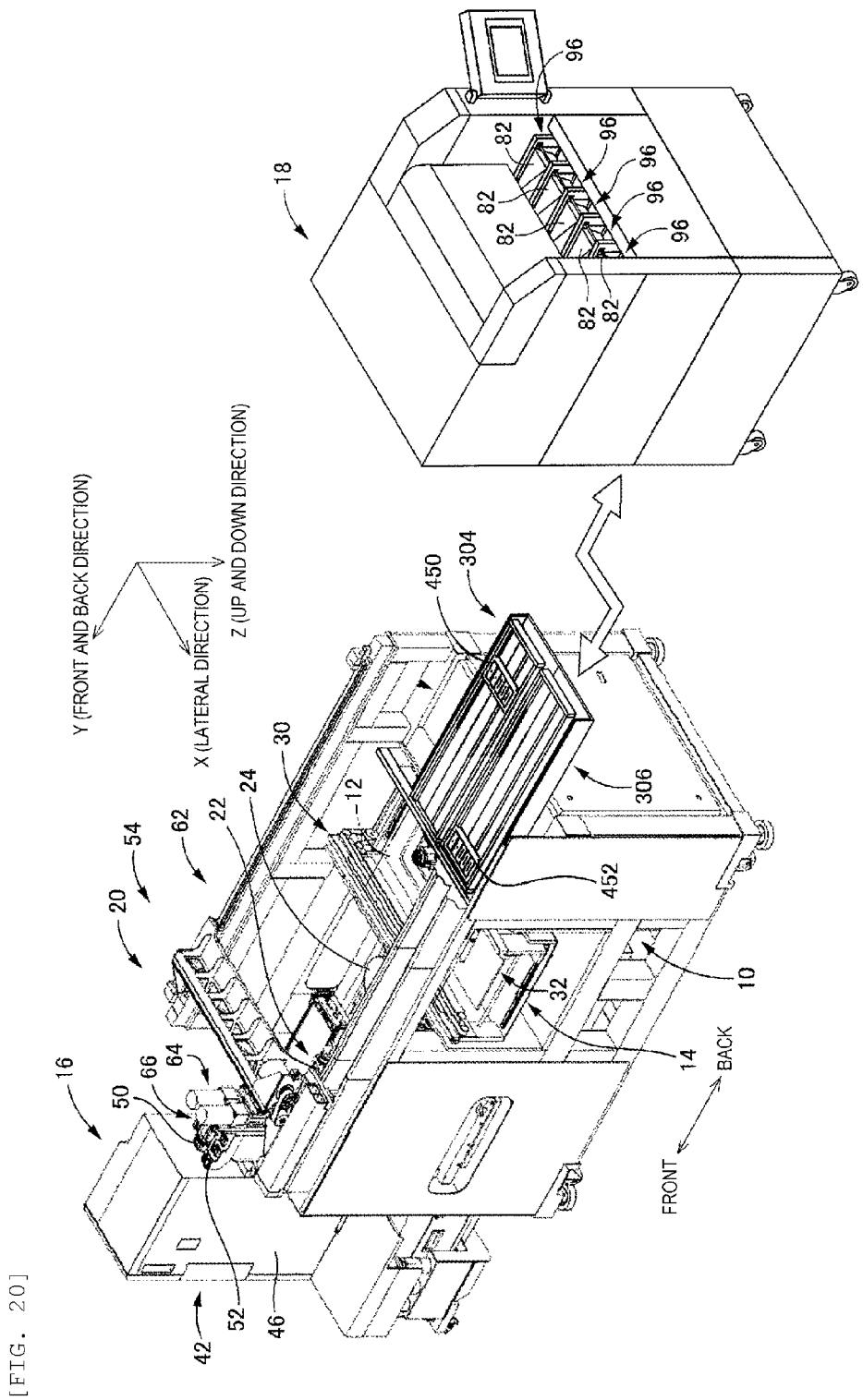

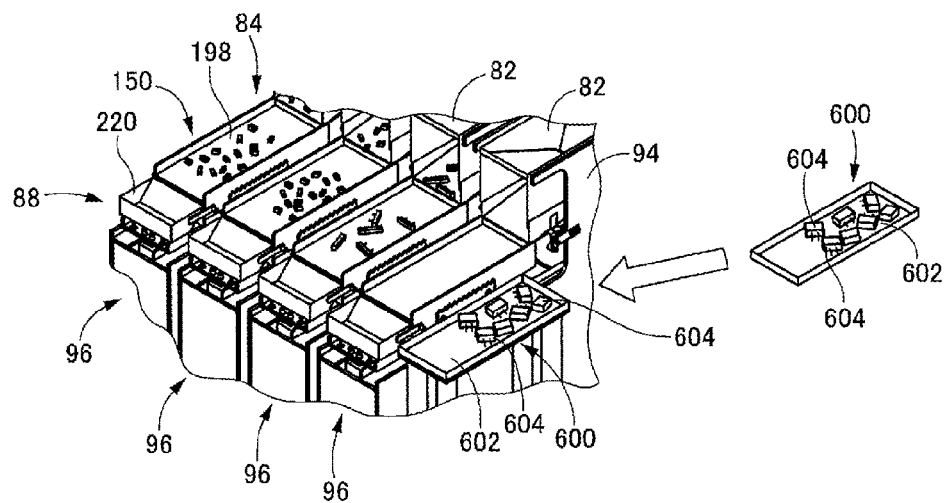
[FIG. 21]
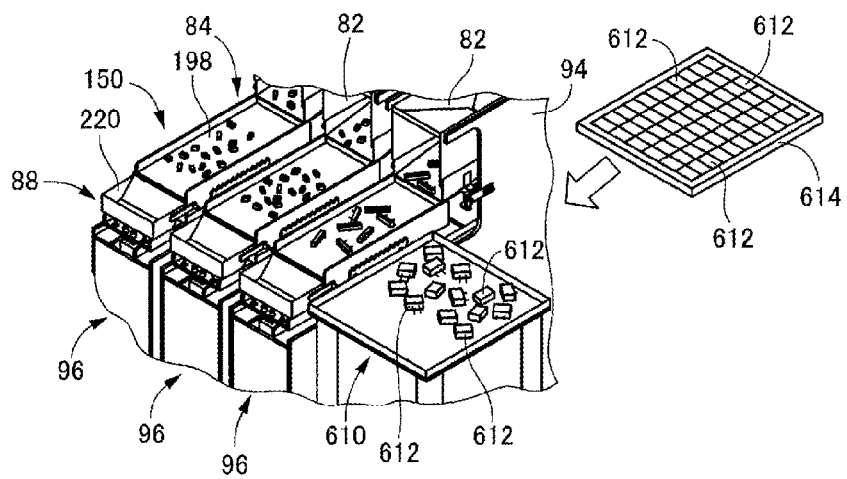
[FIG. 22]

COMPONENT SUPPLY SYSTEM

TECHNICAL FIELD

The present application relates to a component supply system which supplies components to an automated assembly apparatus which performs assembly of the components.

BACKGROUND ART

For example, a component supply device described in PTL 1 is known as an example of a widely used component supply device that sequentially supplies a plurality of components with respect to a component receiving section of an automated assembly apparatus like an electronic circuit component supply device which supplies an electronic circuit component as an attaching target to an electronic circuit assembly apparatus which assembles an electronic circuit by attaching the electronic circuit component to a circuit substrate. The component supply device is configured so as to be provided with (a) a component feeder which accommodates a plurality of components in a bulk state in a random posture and supplies the components, (b) a component dispersed state realization device which realizes a state where a plurality of the components within the component feeder are dispersed on a flat component support surface, (c) an imaging device which images a plurality of the components on the component support surface, and (d) a component return device, in which a component with a posture appropriate for holding is held by a component holding tool of a robot and a component with a posture not appropriate for holding is returned to the component feeder by the component return device based on the imaging results of the imaging device. In addition, a similar component supply device is also described in PTL 2.

CITATION LIST

Patent Literature

PTL 1: JP-A-10-202569
PTL 2: JP-A-7-068426

BRIEF SUMMARY

Problem to be Solved

The present application is made in consideration of the above circumstances, and an object thereof is to improve utility of a component supply system which supplies components in a bulk state to a component receiving section of an automated assembly apparatus.

Means for Solving the Problem

According to the present disclosure, there is provided a component supply system which supplies components in a bulk state to a component receiving section of an automated assembly apparatus in a predetermined posture, the component supply system including (A) a component feeder which accommodates a plurality of components in a bulk state in a random posture, and supplies the accommodated components, (B) a component dispersed state realization device which realizes a state where a plurality of the components within the component feeder are dispersed on a flat component support surface of a component support member, (C) a component delivery device which picks up the components on the component support surface one at a time using a component holding tool and delivers the components to the component receiving section, (D) an imaging device which images a plurality of the components which are dispersed on the component support surface, and (E) a control device which controls the component supply system, in which the control device includes an imaging and holding control section which causes the imaging device to perform the imaging and causes the component holding tool to hold the components in a state in which the component support surface is maintained in a stationary state, in such a manner that the component holding tool holds a component in a state that is appropriate for holding by the component holding tool as a holding target component from among a plurality of the components which are dispersed on the component support surface based on the result of imaging by the imaging device.

It is desirable that the imaging device is able to image at once the component support surface on which a plurality of the components are dispersed, but this is not essential. One component support surface may be partially imaged a plurality of times. In this case, a single component may be imaged for each time of imaging, or a plurality of components may be imaged for each time of imaging.

Examples of the components in the bulk state are, for example, an electronic circuit component, a configuration component of a solar battery, and a configuration component of a power module. Examples of the electronic circuit component are, for example, an electronic circuit component with a lead which has a lead or an electronic circuit component which does not have a lead. Examples of the electronic circuit component with a lead are, for example, a component with a lead to be inserted in a lead insertion hole of a circuit substrate and a component with a lead located on an electrode provided on the component mounting surface of the circuit substrate.

Effects

In a case where a component supply system does not include a component delivery device, it may be necessary to configure an automated assembly apparatus to be capable of receiving a component that is supplied from the component supply system. In contrast to this, since the component supply system according to the present disclosure includes the component delivery device, it is possible to supply the component to the automated assembly apparatus with no or slight change in a configuration of the automated assembly apparatus when the component delivery device is configured to be capable of delivering a component according to the configuration of the automated assembly apparatus.

In addition, imaging of the component on the component support surface and picking up of the component are performed in a state in which the component support surface is maintained in a stationary state, and after imaging, picking up of the component is performed with the component support surface not being moved. For this reason, there is no concern that the component is moved after imaging and it is possible for the component holding tool to reliably hold the component based on the imaging result, unlike in a case where the component support surface is moved after imaging to a position at which it is possible for the component holding tool to perform holding. Furthermore, it is possible to configure the component supply system to be compact in comparison to a case in which an imaging region and a component picking up region are separately set.

BRIEF DESCRIPTION OF DRAWINGS

FIG. 1 is a perspective view illustrating an electronic circuit assembly apparatus which is provided with a component supply system which is an example of the present disclosure.

FIG. 2 is a perspective view illustrating a component mounting device of the electronic circuit assembly apparatus.

FIG. 3 is a perspective view illustrating the component supply system.

FIG. 4 is a perspective view illustrating a component supply unit of the component supply system.

FIG. 5 is a side sectional view illustrating a component feeder of the component supply unit.

FIG. 6 is a perspective view illustrating a state in which a component support member is positioned at a retreat end position in the component supply unit.

FIG. 7 is a perspective view illustrating a feeder vibration device of a component dispersed state realization device of the component supply unit.

FIG. 8 is a perspective view illustrating the feeder vibration device and a component return device of the component supply unit.

FIG. 9 is a side view for explaining an operation of the feeder vibration device.

FIG. 10 is a diagram for explaining returning of the component to the component feeder by the component return device.

FIG. 11 is a perspective view illustrating a state in which the component is returned to the component feeder by a component collecting container of the component return device.

FIG. 12 is a perspective view illustrating a component holding head of the component delivery device and a component holding head moving device.

FIG. 13 is a perspective view illustrating the component holding head.

FIG. 14 is a perspective view illustrating a component carrier of a shuttle device of the component delivery device.

FIG. 15 is a front sectional view illustrating a component receiving member of the component carrier.

FIG. 16 is a perspective view illustrating an example of a component which is supplied by the component supply system.

FIG. 17 is a block diagram conceptually illustrating a control device of the electronic circuit assembly apparatus.

FIG. 18 is a planar view respectively illustrating a state in which holding of the component using a suction nozzle of the component holding head is possible and a state in which the holding is not possible.

FIG. 19 is a side view illustrating a relationship between the component return device during component return in one of five component supply units and the component holding head of the component delivery device of another component supply unit.

FIG. 20 is a perspective view illustrating a state in which the component supply system is removed from an assembly apparatus main body with the shuttle device remaining therein.

FIG. 21 is a perspective view illustrating a state in which a component tray is provided in place of the component supply unit.

FIG. 22 is a perspective view illustrating a state in which the component tray is provided in place of two component supply units and illustrating supply of the component using a component packing member.

DESCRIPTION OF EMBODIMENTS

Applied examples as embodiments of the present disclosure will be described below with reference to the drawings. Here, in addition to the applied examples below, the present disclosure is able to be implemented in various forms which carry out various modifications and improvements based on knowledge of a person skilled in the art.

An electronic circuit assembly apparatus which is one type of automated assembly apparatus is illustrated in FIG. 1. The electronic circuit assembly apparatus includes an assembly apparatus main body 10, a board conveying and holding device 14 which transports and holds a circuit board 12 (hereinafter referred to as a board 12) as a circuit substrate which serves as an assembly target member, component supply systems 16 and 18, a component mounting device 20, imaging devices 22 and 24, and an integrated control device 26 (refer to FIG. 17). Examples of the circuit substrate include a printed-wiring board, a printed-circuit board, a substrate having a three-dimensional shape and the like. The printed-wiring board and the printed-circuit board may be collectively called the circuit board. The electronic circuit assembly apparatus is configured in the same manner as the automated assembly apparatus of the description in JP-A-2011-253869 except for portions which relate to the present disclosure, and similar portions are briefly described.

The board conveying and holding device 14 is provided in the center in a front and back direction of the assembly apparatus main body 10. The board conveying and holding device 14 is provided with a conveyor 30 and a clamping device 32 in the present embodiment, and the board 12 is transported in a horizontal direction in a horizontal posture. In the present embodiment, the conveyance direction of the board 12 (hereinafter, referred to as a board conveyance direction) is an X-axis direction, a direction in which there is a single horizontal plane on a mounting surface of the board 12 which is transported using the board conveying and holding device 14 and which is orthogonal to the X-axis direction on the single horizontal plane is a Y-axis direction, and a direction which is orthogonal to the X-axis direction and the Y-axis direction and an up and down direction or a vertical direction is a Z-axis direction. A width direction or a lateral direction of the electronic circuit assembly apparatus is parallel to the X-axis direction, and the front and back direction is parallel to the Y-axis direction.

The component supply system 16 is provided at the front side of the board conveying and holding device 14. The component supply system 16 includes a tray-type component supply device 42 which supplies an electronic circuit component (hereinafter referred to as a component) using a component tray 40 and a feeder-type component supply device which supplies the component using a tape feeder 44 which serves as a component feeder (refer to FIG. 17). The component tray 40 is accommodated in a tray accommodation device 46, and supplies the component to the component mounting device 20 by moving outside the tray accommodation device 46. The component supply system 18 will be described in detail below.

The component mounting device 20 includes working heads 50 and 52 and a work head moving device 54 in the present embodiment, and configures a component receiving section. The work head moving device 54 is provided with an X-axis-direction moving device 60 (refer to FIG. 2), a Y-axis-direction moving device 62, and Z-axis-direction moving devices 64 and 66. The working heads 50 and 52 are integrally moved in an arbitrary direction on a horizontal plane using the X-axis-direction moving device 60 and the Y-axis-direction moving device 62, and are moved in the Z-axis direction which are independent from each other respectively using the Z-axis-direction moving devices 64 and 66. The work head moving device 54 is configured by the working heads 50 and 52 such that it is possible to move a region from a component supply section of the component tray 40 and the tape feeder 44 to the rear side of the board conveying and holding device 14. The working head 50 in the embodiment is provided with a suction nozzle 70 which sucks and holds the component using negative pressure (refer to FIG. 2), is set as the mounting head which mounts the component on the board 12, and for example, the working head 52 is provided with a dispenser nozzle (not illustrated) and is set as an adhesive application head which applies an adhesive. Hereinafter, the working head 50 is referred to as a mounting head 50, and the working head 52 is referred to as an adhesive application head 52. The imaging device 22 is moved in the X-axis, Y-axis, and Z-axis directions along with the mounting head 50. The imaging device 24 is provided and fixed at a position between the board conveying and holding device 14 of the assembly apparatus main body 10 and the component tray 40 which supplies the component.

The component supply system 18 is described.

As shown in FIG. 1, the component supply system 18 is detachably attached to a rear section of the assembly apparatus main body 10 on the rear side of the board conveying and holding device 14. In the component supply system 18, the board conveying and holding device 14 side is the front and the opposite side from the board conveying and holding device 14 side is the rear. As shown in FIG. 3, the component supply system 18 includes a system main body 80, a component feeder 82, a component dispersed state realization device 84, a component delivery device 86, a component return device 88, and an imaging device 90. The component feeder 82, the component dispersed state realization device 84, and the component return device 88 are assembled in common on a frame 94 to form a set. Hereinafter, the set is referred to as a component supply unit 96. At least one, a plurality in the present embodiment, or five component supply units 96 in the state illustrated and provided, and the component supply units 96 are provided to line up in one row in the lateral direction orthogonal to the front and back direction which is a separation direction of the component feeder 82 and the component mounting device 20 on the system main body 80.

As shown in FIG. 4, the component feeder 82 includes a component accommodation section 100 and a component supply section 102. The component accommodation section 100 is provided above the component feeder 82, has a container form which is open in an upward orientation, and the bottom surface is configured by a pair of inclined surfaces 104 and 106. As shown in FIG. 5, the inclined surfaces 104 and 106 are inclined in orientation to approach each other as far as possible below, and are provided with an opening 108 which passes through in the up and down direction between the lower end sections and extends in the lateral direction. Out of the inclined surfaces 104 and 106, the inclined surface 104 which is provided on the front surface side of the component feeder 82 has a gentler inclination than the inclined surface 106, and an opening 108 is positioned on a rear section of the component accommodation section 100. The component supply section 102 is provided with a component supply surface 110 which is provided below the component accommodation section 100. The component supply surface 110 is an inclined surface which is inclined in an orientation facing downward as far forward as possible, and a front edge section which serves as a leading end section configures a component discharge section 112. The inclination of the component supply surface 110 is gentler than the inclined surface 104. In addition, a plate form scraping-out member 114 which extends out downward from the component supply surface 110 is provided on the front end of the component supply surface 110. The dimensions in the front and back direction of the opening 108 slightly increase according to the accommodated component.

As shown in FIG. 4, the component feeder 82 is hung from above a support shaft 122 which is provided on an upper edge of a rear section of a frame 94 by a pair of hooks 120 (one hook 120 is illustrated in FIG. 4) which are provided on an upper edge of the rear section of the component accommodation section 100, and is supported so as to be able to rotate and be attachable and detachable about a horizontal axis line parallel to the lateral direction. In addition, as shown in FIG. 6, the component feeder 82 is provided such that a plate-form supported section 124 protrudes horizontally respectively in lower sections of each front section as a pair of outer surfaces parallel to the front and back direction, is placed on a horizontal plate-form support section 126 which is provided on the frame 94, and is supported from below. For this reason, the component feeder 82 is movable up and down with respect to the frame 94. A state in which the component feeder 82 is supported by the frame 94 is a state in which an angle that is set in advance with respect to the respective horizontal planes of the inclined surface 104 and the component supply surface 110, in the present embodiment is 15 degrees before or after and 10 degrees before and after being inclined, and the scraping-out member 114 is positioned in a vertical plane. In the component feeder 82, there are a plurality of types in which at least one of the inclination angle of at least one of the inclined surfaces 104 and 106 and the component supply surface 110, and the dimensions of the opening 108 are different, and it is possible to change the type of component which is supplied by the component supply unit 96 by only exchanging the component feeder 82.

As shown in FIG. 4, the component dispersed state realization device 84 includes a component support member 150, a component support member moving device 152 which serves as a relative moving device which relatively moves the component support member 150 and the component feeder 82, and a feeder vibration device 154. The component support member 150 includes a component support section 156 having a longitudinal plate-shape, and a pair of leg sections 158. The leg section 158 is formed in a plate-form, and protrudes up and down at both sides using an upper surface 160 of one plane-form of the component support section 156. The component support member moving device 152 includes a slide 164 and a slide driving device 166 (refer to FIG. 17). The slide 164 is one type of movable member which is similar to another slide in the description below. The slide driving device 166 is configured by a rodless cylinder in the present embodiment.

The component support member 150 is fixed to the slide 164 in a pair of leg sections 158, and moves a position slightly below the lower end of the scraping-out member 114 by the slide 164 moving in the front and back direction by guiding to a pair of guide rails 168 using the slide driving device 166. With respect to the component feeder 82, the component support member 150 is moved in the horizontal direction which is a parallel direction to the upper surface 160, as shown in FIG. 4, is moved to a component supply position at which the entirety of the upper surface 160 is positioned in front of the component feeder 82, and as shown in FIG. 6, to a retraction position at which the front section is positioned below the component feeder 82 and at which the front end of the upper surface 160 is positioned on the front end of the component feeder 82.

As shown in FIG. 7, the feeder vibration device 154 of the present embodiment includes a cam member 180, a cam follower 182, and a stopper 184 which serves as a rotation limit regulation member. The cam member 180 is formed in a plate form, and is fixed parallel to the front and back direction on one outer surface of a pair of leg sections 158. A large number of teeth 190 in the cam member 180 are provided at equal intervals in a direction parallel to the front and back direction. The large number of teeth 190 are respectively defined by an inclined surface 192 which is inclined in an orientation upward toward the rear and a vertical surface 194 which extends out downward in the vertical direction from the upper end of the inclined surface 192, and are configured by the cam surface 196 with a large number of concavities and convexities lined up along a straight line parallel to the front and back direction using the inclined surface 192 and the vertical surface 194. In the present embodiment, as shown in FIG. 4, the cam member 180 is provided in a section in the front and back direction of the component support member 150, and out of the upper surface 160, a portion which corresponds to the cam member 180 functions as a component support surface 198 in the front and back direction.

As shown in FIG. 8, the cam follower 182 includes a lever 202 which is attached to be able to rotate about an axis line parallel to the lateral direction using a bracket 200 on the outer surface of the component feeder 82, and a roller 204 which is attached to be able to rotate about the axis line parallel to the lateral direction in a free end section of the lever 202. The lever 202 biases the roller 204 in an orientation toward the front using a torsion coil spring 206 which serves as a spring member that is one type of biasing means (refer to FIG. 9). The stopper 184 is provided on the bracket 200, is formed in a protruding shape, and the rotation limit of the lever 202 is regulated by biasing the torsion coil spring 206. In a state in which the rotation limit is regulated, as shown in FIG. 7, the cam follower 182 has a posture which protrudes downward from the component feeder 82 in the vertical direction.

The component return device 88 will be described.

As shown in FIG. 11, the component return device 88 of the present embodiment includes the scraping-out member 114, a component collecting container 220, a component collecting container lifting and lowering device 222 which serves as a relative lifting and lowering device and a motion conversion mechanism 224. The component collecting container lifting and lowering device 222 includes a lifting and lowering member 226 which is a movable member, and an air cylinder 228 which serves as a lifting and lowering member driving device. The air cylinder 228 is disposed oriented upward at a position between the pair of guide rails 168, and is lifted and lowered with respect to the component feeder 82 by the lifting and lowering member 226 due to expansion and contraction of a piston rod 230. The air cylinder 228 is formed on the front end section of the slide 164, and the lifting and lowering member 226 is moved in the front and back direction along with the component support member 150.

The component collecting container 220 is attached so as to be able to horizontally rotate about a rotation axis parallel to the lateral direction using an axis 232 in the lifting and lowering member 226, and is provided to be able to be lifted and lowered to the front end section of the component support member 150. The component collecting container 220 is lifted and lowered to a lowering end position which is a position below the upper surface 160 of the component support member 150 as shown in FIG. 10(a), and a lifting end position which is positioned above the component feeder 82 as shown in FIG. 11, due to the lifting and lowering of the lifting and lowering member 226.

In addition, above the lifting and lowering member 226, the component collecting container 220 is rotated to a component reception position at which the bottom surface is open above a horizontal posture, and a component discharge position at which the component with a vertical posture is discharged to the component feeder 82. The component collecting container 220 is biased in an orientation that rotates to a component reception position side by a torsion coil spring (not illustrated) which serves as biasing means. The rotation limit of the component collecting container 220 due to the biasing is regulated by a pair of stoppers 234, and normally the component collecting container 220 is positioned at the component reception position. In addition, a rear wall 236 of the component collecting container 220 is inclined in an orientation at a posture downward furthest to the rear at the component discharge position.

As shown in FIGS. 8 and 11, the motion conversion mechanism 224 includes a pair of rollers 240 which configure an engaged section by providing in the component collecting container 220 and a pair of engagement surfaces 242 which configure an engaging section by being provided in the frame 94. One roller 240 and an engagement surface 242 are illustrated in FIGS. 8 and 11. The roller 240 is attached to be able to rotate about an axis line parallel to the lateral direction in a projecting end section of a support member 244 that is fixed to protrude out to the rear from the component collecting container 220 which is positioned at the component reception position. The engagement surface 242 is provided in a portion which corresponds to the upper end section of the component accommodation section 100 of the frame 94, and is a horizontal plane with a downward orientation.

A shutter 250 is disposed to be able to be lifted and lowered between the component collecting container 220 on a leading end which is the front end of the component support member 150. As shown in FIG. 10(c), the lifting and lowering of the shutter 250 is guided by being engaged to be relatively movable by a protruding section 254 which is provided on the leading end of the slide 164 on a pair of long holes 252. In addition, the shutter 250 is biased above by a compression coil spring 255 as biasing means that is engaged with a pair of rods 253 that are erected on the slide 164. An upper limit of the shutter 250 due to biasing is regulated by the lower end section of the long hole 252 abutting the protruding section 254, and in this state, the shutter 250 protrudes above the component supply surface 110 of the component supply unit 96, and is positioned at a shielding position which prevents the component from falling from the component supply surface 110. In a state in which the component collecting container 220 is positioned at the lowering end position, as shown in FIG. 10(a), an engaging section 256 with a protruding shape which is provided on a rear end section of the lifting and lowering member 226 abuts from above an engaged section 258 with the protruding shape which is provided on a lower end section of the shutter 250, the shutter 250 is lowered opposing biasing force of the compression coil spring 255, and is positioned at a non-shielding position which is positioned below the upper surface 160 of the component support member 150.

The imaging device 90 is described based on FIG. 3.

For example, the imaging device 90 is provided with a CCD camera or a CMOS camera which serves as an imager, images a section of the upper surface 160 of the component support member 150 in the front and back direction, and has a field of view in which it is possible to image the entirety of the upper surface 160 in the lateral direction. An imaging device moving device 270 includes a slide 272 and a slide driving device 274 in the present embodiment (refer to FIG. 17). The slide driving device 274 includes an electric motor 276 which serves as a driving source and a feeding screw mechanism 278. The feeding screw mechanism 278 includes a nut 280 and a feeding screw 282, the slide 272 is guided to a guide rail 284 and is moved to an arbitrary position in the lateral direction by a feeding screw 282 being rotated by the electric motor 276. The imaging device 90 is provided on the slide 272, is not moved in the front and back direction, and is moved only in the lateral direction. It is desirable that the electric motor 276 is a servomotor which is a type of electric rotary motor which is able to carry out accurate control of the rotation angle, and it is desirable that the feeding screw mechanism is a ball screw mechanism. It is possible to adopt a stepping motor or a linear motor as the electric motor. Another electric motor and feeding screw mechanism are described below in the same manner.

In the present embodiment, the component support surface 198 is slightly smaller than the field of view of the imaging device 90 in the front and back direction, and the lateral direction is the size of the entirety of the upper surface 160. The length of the cam member 180 is set in combination with the height in the front and back direction of the component support surface 198. The imaging device 90 is disposed in a downward orientation above the component support surface 198 of the component support member 150 which is positioned at the component supply position, and is disposed at a posture which faces the component support surface 198. The imaging device 90 is moved by the imaging device moving device 270, selectively faces each of the component support surfaces 198 of the component supply unit 96 of five sets, and images a plurality of components on each component support surface 198 at each of the five imaging positions. Here, the component support surface may be larger than the field of view of the imaging device. This is because, a component which is located on the component support surface and whose entire image cannot be obtained because only a portion of which is positioned within the field of view, as well as a component whose image cannot be obtained because the entire portion of which is positioned outside of the field of view, is determined not to be appropriate for holding, and therefore such a component is not picked up from the component support surface. Alternatively, the imaging device moving device may be an apparatus which moves the imaging device also in the front and back direction, and image the entirety of the component support surface.

The component delivery device 86 is described based on FIG. 12.

The component delivery device 86 in the present embodiment includes a component holding head 300, a component holding head moving device 302, and one or more, for example, a plurality, two shuttle devices 304 and 306 in the present embodiment (refer to FIG. 3). The component holding head moving device 302 includes an X-axis-direction moving device 320, a Y-axis-direction moving device 322, and a Z-axis-direction moving device 324, and the component holding head 300 is moved in each direction of the X axis, the Y axis, and the Z axis. The X-axis direction and the Y-axis direction are a first direction and a second direction which are orthogonal to each other in parallel to the component support surface 198, and the Z-axis direction is a third direction orthogonal to the component support surface 198. The Y-axis-direction moving device 322 is provided on the system main body 80 and includes a Y-axis slide 326 and a Y-axis slide driving device 328. The Y-axis slide driving device 328 is provided with an electric motor 330 and a feeding screw mechanism 336 which includes a feeding screw 332 and a nut 334, and moves to an arbitrary position in the Y-axis direction while guiding the Y-axis slide 326 on a pair of guide rails 338.

The X-axis-direction moving device 320 is provided on the Y-axis slide 326, and includes an X-axis slide 340 and an X-axis slide driving device 342. The Z-axis-direction moving device 324 is provided on the X-axis slide 340, and includes a Z-axis slide 344 and a Z-axis slide driving device 346. The X-axis slide driving device 342 and the Z-axis slide driving device 346 are configured in the same manner as the Y-axis slide driving device 328, and a corresponding relationship is indicated by giving the same reference numerals in the configuration elements which have the same function, and description is omitted.

The component holding head 300 is provided on the Z-axis slide 344. The component holding head moving device 302 is provided with the component holding head 300 in the Z-axis-direction moving device 324, and so as to move the height between the imaging device 90 and the component support surface 198. In the region in the height direction, the component holding head 300 is moved to an arbitrary position in the horizontal direction and the vertical direction. Accordingly, the imaging device 90 and the component holding head 300 are able to be positioned simultaneously on the component support surface 198 of the same component supply unit 96, and the component holding head 300 is positioned above the component support surface 198 due to movement in at least one of the X-axis direction and the Y-axis direction and movement in the horizontal direction, and the component on the component support surface 198 is moved to a function position at which the component is able to be held and a retraction position which is retreated from the function position. As shown in FIG. 13, the component holding head 300 includes a head main body 360 which is provided integrally with the Z-axis slide 340, a suction nozzle 362 which serves as a component holding tool, a nozzle rotation device 364 which serves as a holding tool rotating device and a nozzle pivoting device 366 which serves as a holding tool pivoting device. Here, other than a suction nozzle, for example, a plurality of gripping members are provided in the component holding tool, and it is possible to adopt a component gripper which grips and releases the component by the gripping members being moved relative to each other.

The nozzle pivoting device 366 includes a linking mechanism 370 and a linking mechanism driving device 372. The linking mechanism driving device 372 includes a lifting and lowering member 374 which serves as a driving member and a lifting and lowering member driving device 376. The lifting and lowering member driving device 376 is provided with an electric motor 378, and a feeding screw mechanism 384 which includes a feeding screw 380 and a nut 382, transmits rotation of the electric motor 378 to the feeding screw 380 using timing pulleys 386 and 388 and a timing belt 390, and is lifted and lowered by the lifting and lowering member 374. A spline shaft 392 is attached to the lifting and lowering member 374 in an orientation which extends out vertically below. One end section of a lever 394 is attached to be able to rotate about the horizontal axis line on the lower end section of the spline shaft 392 using a shaft 395, and the suction nozzle 362 is detachably held using a nozzle holding member 396 which serves as a component holding tool holding member that is provided on the lever 394.

In the lever 394, an arm 400 protrudes in an orientation which sterically intersects orthogonal to the rotation axis of the lever 394, and in a projecting end section thereof, a pair of rollers 402 is configured by the cam follower to be attached to be able to rotate about the axis line which is parallel to the rotation axis of the lever 394. The pair of rollers 402 are respectively engaged with a pair of horizontal long holes 406 of the cam member 404 which is provided to be immovable in the up and down direction on the head main body 360. As shown in FIG. 13(a), in a state in which the lifting and lowering member 374 is positioned at the lifting end position, in the suction nozzle 362, the axis line is positioned at the non-pivoting position concentric with the spline shaft 392. When the lifting and lowering member 374 is lowered, the lever 394 is rotated due to the lowering of the roller 402 being prevented by the cam member 404, and the suction nozzle 362 is pivoted about a horizontal pivot axis line. In a state in which the lifting and lowering member 374 is lowered to the lowering end position, the suction nozzle 362 is pivoted 90 degrees and the axis line is horizontal. The non-pivoting position and the 90 degree pivoting position are determined by positional control of the lifting and lowering member 374 due to control of the electric motor 378. The suction nozzle 362 is also able to be held at an arbitrary pivoting position between the non-pivoting position and the 90 degree pivoting position.

The nozzle rotation device 364 includes an electric motor 410 and a rotation transmitting device 412 which are attached via a not-illustrated attachment member in the head main body 360. The rotation transmitting device 412 includes a gear 414 which is attached to an output shaft of the electric motor 410 and a gear 418 fixed in a spline member 416 that is engaged with the spline shaft 392 to be relatively unrotatable and relatively movable in an axial direction, and the spline shaft 392 is rotated at an arbitrary angle in both forward and reverse directions about a vertical axis line. Rotation is transmitted to the spline shaft 392 at some position in the up and down direction, and the suction nozzle 362 is able to rotate at an arbitrary angle about the vertical axis line which is an axis line that is orthogonal to the horizontal component support surface 198. It is possible to fix the cam member 404 to the spline member 416, rotate the cam member 404 with the spline shaft 392 and the suction nozzle 362, and pivot the suction nozzle 362 even in a state of positioning at any rotation position.

In the suction nozzle 362, there are a plurality of different types of dimensions and shapes of a suction surface of a suction pipe, and the type of suction nozzle 362 is used according to the type of supplied component. For this reason, as shown in FIG. 3, in the system main body 80, a nozzle accommodation device 430 which accommodates a plurality of types of suction nozzles 362 is provided. The component holding head 300 is moved to the nozzle accommodation device 430 according to need, and the suction nozzle 362 is automatically exchanged according to the type of component which is supplied by five sets of component supply units 96.

As shown in FIG. 3, the shuttle devices 304 and 306 respectively include component carriers 450 and 452 and component carrier moving devices 454 and 456, and are provided to line up in the lateral direction further to the front side than the component supply unit 96 of the system main body 80. In the present embodiment, each of the component carriers 450 and 452 detachably holds a component receiving member 460 to configure a component receiving section. As shown in FIG. 14, the component receiving member 460 is engaged in a recessed section 462 of the component carriers 450 and 452, and is held by respectively positionally aligning in the front and back direction and the lateral direction using protruding sections 464 and 466. The component carriers 450 and 452 are respectively able to hold at least one component receiving member 460, a plurality in the present embodiment, for example, five in a state of being lined up in a row in the lateral direction.

An example of the component which is supplied by the component supply system 18 is an electronic circuit component with a lead, such as, for example, a component 480 illustrated in FIG. 16 which includes a component main body 482 having a block shape and one or plural leads 484 (two leads in the case of the illustrated component 480) protruding from one side surface of the component main body 482. The electronic circuit component with a lead is an example of a component which is provided with a protruding section which protrudes from one surface and to be inserted in a concave section of an assembly target member. Four side surfaces 486 which are parallel to the lead 484 of the component main body 482 are orthogonal to each other, and in a case of being located on a horizontal support surface in each side surface 486, are able to be stationary in a posture in which the lead 484 is horizontal. In addition, three out of four side surfaces 486 configure a suction surface which closes the opening of the suction pipe of the suction nozzle 362 and has an area which is able to be sucked by preventing leakage of negative pressure, but as shown in FIG. 16(b), one indentation 488 is provided, the surface area is not sufficient to close the opening of the suction pipe, and suction is not possible.

As shown in FIG. 14, a component receiving recess section 500 is provided on the component receiving member 460. The component receiving recess section 500 is provided according to the shape and dimensions of the received component, the component receiving recess section 500 of the component receiving member 460 into which the electronic circuit component with a lead is inserted is, for example, formed in a step shape as shown in FIG. 15(a), and includes a main body section receiving recessed section 502 which opens to the upper surface of the component receiving member 460 and a lead receiving recess section 504 which opens to the bottom surface of a main body section receiving recessed section 502. On an opening end section of the main body section receiving recessed section 502, Chamfering is performed, a guide surface 506 which guides engagement of the component is formed, and is configured by a guide section. As shown in FIG. 15(b), the component 480 is accommodated by the lead 484 on the lead receiving recess section 504 in a posture in a downward orientation using the component receiving member 460, positionally aligns the main body section 482 in the horizontal direction by engaging with the main body section receiving recessed section 502, is supported from below using a component support surface 508 with an upward orientation which is configured by the bottom surface of the main body section receiving recessed section 502, and is received in a state of positional alignment in the up and down direction.

As exemplified in FIG. 14, there are a plurality of different types of dimensions and shapes of the component receiving recess section 500 in the component receiving member 460, and are exchanged by the operator. It is also possible to hold a component receiving member which has a plurality of dimensions of the component receiving member 460 on the component carriers 450 and 452. Here, the component carriers may be integrally provided with the component receiving section. In addition, it is not essential to provide the guide section in the component receiving recess section, and may be omitted.

As shown in FIG. 3, each moving device main body 520 of the component carrier moving devices 454 and 456 is provided parallel to the front and back direction in the system main body 80, and is provided with an endless belt 522 and a belt rotation device 524 (refer to FIG. 17). The component carrier moving devices 454 and 456 are configured in the same manner, and a part is described. The belt 522 is wound onto a plurality of pulleys (not illustrated) which is provided to be able to be rotated about the axis line parallel to the lateral direction in the moving device main body 520, and is locked to the component carrier 450. The belt 522 is rotated by rotating the pulley using the electric motor 528 (refer to FIG. 17), and the component carrier 450 is guided to a pair of guide rails 530 (one guide rail 530 is illustrated in FIG. 3), and is moved in the front and back direction. The component carriers 450 and 452 are moved independently from each other between a component receiving position which is positioned in a front section of a movement region of the component holding head 300, close to the component holding head moving device 302, and adjacent to the component supply unit 96, and a component delivery position which is positioned in a rear section of the movement region of the mounting head 50, and close to the component mounting device 20. The component carriers 450 and 452 are positionally aligned with the component receiving position and the component delivery position using a stopper (not illustrated) which is provided on the moving device main body 520.

The integrated control device 26 configures a computer as a main body. As shown in FIG. 17, in the electronic circuit assembly apparatus of the present embodiment, the board conveying and holding device 14 and the like are each individually provided in the control device, the driving source and the like of each device is controlled, and imaging data of the imaging devices 22 and 24 is subject to image processing. The component supply system 18 is also provided with an individual control device 550, the slide driving device 166 or the like is controlled, and data which is obtained by imaging of the imaging device 90 is processed by an image processing device 552. The integrated control device 26 integrally controls the individual control devices.

Next, an operation is described.

The board 12 is conveyed to the electronic circuit assembly apparatus using the conveyor 30 and clamping using the clamping device 32 by stopping in an assembly position during electronic circuit assembly. Then, the mounting head 50 is moved, and the component which is supplied using the component supply systems 16 and 18 is assembled on the board 12.

Supply of the component using the component supply system 18 will be described. In the present embodiment, the component which is supplied using five sets of component supply units 96 being some electronic circuit component with a lead, and is denoted by the reference numeral 480. Component supply actions by the component supply units 96 are the same, and one is described.

A plurality of components 480 are putted in the component accommodation section 100 of the component feeder 82. During component inputting, as shown in FIG. 6, the component support member 150 is positioned at the retraction position. Some of the input components passes through the opening 108 and is lowered onto the component supply surface 110, is moved to the component discharge section 112 side due to the inclination of the component supply surface 110, and is spread on the component supply surface 110. In a state in which the component 480 is clogged and the opening 108 is blocked, the lowering of the component to the component supply surface 110 is stopped, and a plurality of the components 480 are accommodated in the component accommodation section 100 in a bulk state with a random posture. Even if the component 480 which is lowered onto the component supply surface 110 moves beyond the component discharge section 112, the component 480 is accommodated in the component collecting container 220. The component collecting container 220 is positioned at the retraction position along with the component support member 150, and is positioned at the lowering end position along with the component reception position.

After component inputting, the component support member 150 advances, and slips out from below to in front of the component feeder 82. If the cam member 180 reaches the cam follower 182, the roller 204 is lifted along the inclined surface 192 of the teeth 190, and if reaching the vertical surface 194, the roller is lowered and rides over the teeth 190. The cam follower 182 is biased in an orientation to mesh with the teeth 190 using the torsion coil spring and regulates the rotation limit using the stopper 184, during advancing of the component support member 150, the roller 204 is maintained in the state of meshing with the teeth 190, as shown in FIG. 7, the lever 202 does not rotate, and the cam follower 182 rides over the teeth 190 along with the component feeder 82. The cam follower 182 rides over a plurality of the teeth 190 one at a time, the front section of the component feeder 82 is lifted up by repeating lifting, and vibrated in the up and down direction. At this time, lifting from the support shaft 122 of the component feeder 82 is avoided due to own weight.

The component on the component supply surface 110 moves forward due to vibration and an inclination of the component supply surface 110, and as shown in FIG. 7, is discharged from the component discharge section 112 on the component support surface 198. At this time, lowering of the component 480 is prevented due to the pair of leg sections 158 which protrude above the upper surface 160. In addition, the component 480 in which the opening 108 is blocked is broken up and is lowered on the component supply surface 110 due to vibration of the component feeder 82, and the component 480 in the component accommodation section 100 passes through the opening 108 and is lowered on the component supply surface 110 and discharged. Accompanying the advancing of the component support member 150, a different portion of the component support surface 198 sequentially corresponds to the component discharge section 112, the area of the component support surface 198 increases, and sequentially, the component 480 is supported. The advancing direction of the component support member 150 is a positive direction, and a retreat direction is a reverse direction, during advancing of a component support member 160, the component feeder 82 is vibrated only in a period in which the cam follower 204 rides over the cam member 180, and the component 480 is discharged from the component discharge section 112. The cam member 180 is separated from a cam follower 182 before the component support member 150 reaches the component supply position, the component support member 150 is advanced, but the component feeder 82 is not vibrated, and the component is not discharged. For this reason, a state in which the component support member 150 reaches the component supply position is a state in which in the upper surface 160, the component 480 is dispersed in only the component support surface 198.

After the component support member 150 stops, the imaging device 90 is moved, and a plurality of the components 480 which is dispersed on the component support surface 198 is imaged all at once. Based on the imaging data, the component of a state which is appropriate to hold using the suction nozzle 362 is determined to be a holding target component. For example, if the holding target component is the component 480 in the illustration in FIG. 16, as shown in FIG. 18(*a*), the lead 484 is isolated from another component 480 in a posture which extends in a direction parallel to the component support surface 198, and a side surface 486 on which suction by the suction nozzle 362 is possible has a posture facing upward. In contrast to this, as exemplified in FIG. 18(*b*), the component 480 of an inclined state or the lead 484 is parallel to the component support surface 198, but the component 480 of the posture at which the side surface 486 on which suction is not possible faces upward is not appropriate in holding, and a non-holding target component is set. Posture model data of the holding target component is formed in advance for each type of component, is stored in a posture model data memory which is provided in a RAM of a computer constituting a main part of the individual control device 550 and configures storage means, and the posture model data is compared with posture data of the component which is obtained by imaging.

During imaging, the component holding head 300 is positioned at the retraction position, and imaging of the component is permitted by the imaging device 90. After imaging, the component holding head 300 is moved to the function position, and after imaging by the imaging device 90, the holding target component is held on the component support surface 198 which maintains a stationary state of stopping without change. In a case where there are a plurality of holding target components, the components are held one by one according to an order set in advance. For example, the order is an order of holding from the component which is positioned on the frontmost side in the front and back direction, and positioned furthest on the downstream side in the board conveyance direction in the lateral direction. Since the component holding head 300 moves a height region between the imaging device 90 and the component support surface 198, after imaging, the imaging device 90 may not retreat from above the component support surface 198 when the component holding head 300 holds the component. In addition, the imaging device 90 is able to move to the function position of the component holding head 300 or move on the component support surface 198 of another component supply unit 96 in parallel to a component holding operation.

Each position and rotation position (position about the axis line) in the X-axis and Y-axis directions of the holding target component is acquired based on imaging of the imaging device 90. The component holding head 300 is moved and lowered to the acquired position, and the component 480 is sucked and picked up due to negative pressure by the suction nozzle 362. After suction of the component, the suction nozzle 362 is moved to the component carrier which is positioned at the component receiving position. During suction of the component, the suction nozzle 362 is positioned at the non-pivoting position, is pivoted to the 90 degree pivoting position during movement of the component carrier, and the lead 484 is orientated downwards. However, since the pivot direction is determined in one direction, prior to suction of the component 480, the suction nozzle 362 is rotated about the own axis line in a state of position at the non-pivoting position, a vertical pivot plane of the suction nozzle 362 is parallel to the vertical plane parallel to a longitudinal direction of the lead 484 of the component 480 which is located on the component support surface 198, and the lead 484 is positioned at the rotation position orientated downward due to pivoting.

In addition, after suction of the component, the suction nozzle 362 is rotated about the axis line of the spline shaft 392, and the rotation phase about a vertical line of the component main body 482 matches the rotation phase of the main body section receiving recessed section 502. The component holding head 300 is lowered on the component receiving recess section 500, the component 480 is guided to the guide surface 506 and is received on the component receiving recess section 500. After this, the component 480 is released by cutting supply of negative pressure to the suction nozzle 362, the component holding head 300 is lifted, and the suction nozzle 362 is pivoted and is returned to the non-pivoting position.

The component imaging by the imaging device 90 is performed in advance in holding in each holding of the component 480 using the component holding head 300, and the component 480 is sucked on the component support surface 198 by the suction nozzle 362, then imaging is performed concurrent to receiving in the component receiving recess section 500. When a plurality of the components 480 are discharged continuously from the same component supply unit 96, the imaging device 90 is positioned without change on the component support surface 198 of the component supply unit 96, the component holding head 300 in which the component 480 is held retreats, then imaging is performed. Thereby, for example, if a position and posture of the component 480 which is to be held subsequently by holding the former component 480 in one component supply unit 96 are changed, or even if the holding target component is in a non-holding target component, the change is acquired, and the holding target component is reliably held. Here, when the components 480 are picked up from another component supply unit 96, the imaging device 90 performs imaging by moving above the component supply unit 96.

The component holding head 300 reciprocally moves between the component carriers 450 and 452 and the component support surface 198, the component is selectively picked up from five component supply units 96 and is held in the component carrier 450 or the component carrier 452. When the components 480 are received in all of the component receiving members 460 of the component carrier which is positioned at the component receiving position, the component carrier is moved to the component delivery position. The mounting head 50 of the component mounting device 20 is moved to the component carrier which is positioned at the component delivery position, and the component on the component receiving member 460 is sucked by the suction nozzle 70 and picked up. The component 480 is accommodated in the component receiving member 460 in a state in which the lead 484 is oriented downward and the suctionable side surfaces 486 are upper surfaces, and it is possible for the suction nozzle 70 to reliably suck the component 480.

After a component is picked up, the mounting head 50 is moved to the imaging device 24, and the component 480 which is held in the suction nozzle 70 is imaged. Based on the imaging data obtained as a result of imaging, a phase difference between a rotation phase about the vertical line of the component 480 and a mounting phase of the circuit board 12, and a holding position error of the component 480 using the suction nozzle 70 are calculated, and both are corrected and the component 480 is mounted on the board 12. The lead 484 is inserted in a lead insertion hole of the board 12, and the component 480 is attached on the board 12. When the components 480 are picked up from all of the component receiving members 460 of the component carrier which is positioned at the component delivery position, the component carrier is moved to the component receiving position. Two component carriers are provided, and it is possible to perform reception of the component and delivery of the component concurrently using the component carrier. For this reason, there is no time at which the mounting head 50 waits for movement to the component delivery position of the component carrier, or the waiting time is short, and reduction of the component mounting efficiency is avoided or suppressed.

Here, other than the imaging device 24, the imaging device may be provided in order to acquire a holding state (rotation phase about the vertical line and holding position error) using the component holding tool of a component which is supplied by the component supply system 18. For example, the imaging device is provided in a portion at a rear side using the board conveying and holding device 14 of the assembly apparatus main body 10, the component is picked up from the component carrier by the mounting head 50, then is moved to the imaging device and the component is imaged.

If there is no holding target component on the component supply unit 96, the component supply of the component support surface 198 is performed. Presence or absence of the holding target component is determined based on imaging data, and if not present, the component support member 150 retreats to the retraction position. At that time, if there is a component 480 which remains on the component support surface 198 which is not determined in the holding target component, the component 480 is returned to the component feeder 82 using the component return device 88. The main returned component 480 is the component 480 which remains on the component support surface 198 as the component in a state which is not appropriate in holding by the suction nozzle 362, but when planned assembly work ends, the component 480 which remains in the component support surface 198 may also be returned.

As shown in FIG. 8, the component 480 which remains on the component support surface 198 is moved forward with respect to the component support member 150 by hindering retreat using the scraping-out member 114, and is scraped away in the component collecting container 220. During retreat of the component support member 150, force acts in the same direction as the retreat direction of the component support member 150 to the cam follower 182 from the cam member 180, but the stopper 234 permits free rotation in the direction of the cam follower 182. Thereby, as shown in FIGS. 8 and 9, the cam follower 182 rides over the teeth 190 by rotating with respect to the component feeder 82 opposing biasing force of the torsion coil spring 206, and the component feeder 82 is not vibrated, and the component support member 150 is retreated. For this reason, the component does not fall from the component accommodation section 100 on the component supply surface 110, and is not also discharged to the component support surface 198.

As shown in FIG. 10(a), after movement to the retraction position of the component support member 150, as shown in FIG. 10(b), the component collecting container 220 is lifted with respect to the component feeder 82. The shutter 250 is lifted due to biasing of the compression coil spring 255 accompanying lifting of the component collecting container 220, and as shown in FIG. 10(c), in the shielding position, the component discharge section 112 is blocked. The roller 240 is lifted along the outer surface of the component feeder 82 along with the component collecting container 220. After the component collecting container 220 is moved to the shielding position of the shutter 250, the component collecting container 220 is further lifted, and the end of lifting movement at which the component collecting container 220 is lifted in the vicinity of the lifting end position, as shown in FIG. 11, the roller 240 abuts the engagement surface 242 and lifting is prevented. Thereby, the component collecting container 220 is rotated to the component discharge position opposing the biasing force of the torsion coil spring during further lifting up to the lifting end position, and the recovered component 480 is discharged in the component accommodation section 100. A state in which the component collecting container 220 is rotated to the component discharge position is a state in which the bottom surface is vertical, and the rear wall 236 faces the component accommodation section 100 downward, and the component 480 is discharged to the component accommodation section 100 without remaining by being guided to the rear wall 236.

Also during performance of returning of the component to the component feeder 82 in any of the five component supply units 96, it is possible to perform imaging and holding of the component 480 of another component supply unit 96 using the imaging device 90 and the component holding head 300. As shown in FIG. 19, with respect to performing return of the component in a state in which the component support member 150 is returned to the retraction position, the component support surface 198 is provided on the front section side of the component support member 150, without interfering with the component collecting container 220, imaging and holding of the component 480 on the component support surface 198 is performed.

The component supply system 18 is able to be removed from the assembly apparatus main body 10. In the present embodiment, as shown in FIG. 20, the component supply system 18 removes the shuttle devices 304 and 306 which remain in the assembly apparatus main body 10, and maintenance is performed from the rear section side of the assembly apparatus main body 10. During attachment of the assembly apparatus main body 10 of a portion which is removed from the component supply system 18, matching of each position of the portions of the X axis, the Y axis, and the Z-axis directions is performed, but since the shuttle devices 304 and 306 are not removed in which high positioning accuracy is necessary with respect to the component mounting device 20, positional alignment is easy accompanying attachment and removal of the component supply system 18. In this meaning, the shuttle devices 304 and 306 are not configuration elements of the component supply system 18, and it is also possible to consider that there are configuration elements of the component mounting device. In that case, the shuttle devices 304 and 306 are component receiving sections of the component mounting device.

Here, the shuttle devices 304 and 306 may also be removed from the assembly apparatus main body 10 along with the component supply unit 96 and the like.

In addition, by the component feeder 82 hangs and releases the hook 120 on the support shaft 122, it is possible to easily remove and exchange the frame 94, and it is possible to easily correspond to change over and the like by exchanging only the component feeder 82 of the component supply unit 96. Here, the component feeder may attach and detach only the component accommodation section from the frame, and the component supply section may be shared with a plurality of component accommodation sections.

As apparent from the above description, in the present embodiment, imaging is performed in the imaging device 90 of the individual control device 550, the holding target component is determined based on the imaging result, and a portion which is held in the suction nozzle 362 is configured by an imaging and holding control section.

As shown in FIG. 21, a hand placement component tray 600 which serves as a hand placement component support member may be provided to be attachable and detachable in place of the component supply unit 96. The hand placement component tray 600 provides a one plane-form component support surface 602, and after attachment of the system main body 80, alternatively, prior to attachment, the component 604 is placed outside of the component supply system by an operator. Supply of the component which is used in such a hand placement component tray is appropriate in supply of a component in which the lead which tends to bend, a component which is not to come into contact with other components, a component to which applying vibration is not desirable, a large component, and the like.

As shown in FIG. 22, a hand placement component tray 610 may have a plurality of dimensions of the component supply unit 96 in the lateral direction. In addition, in the front and back direction, the hand placement component tray may have a larger dimension than the field of view of the imaging device 90, and the entirety of the upper surface may be the component support surface. In the case of the latter, the imaging device moving device also moves the imaging device in the front and back direction. Furthermore, a component 612 may be supplied by packing without change during shipping. The component packing member 614 in which a plurality of the components 612 are aligned and accommodated for shipping is set in a component tray, and the component 612 is supplied. In a case where conditions match in supply of the component using the component packing member 614, for example, in a case where the component packing member 614 has a settable size in a component tray, a case where the component 612 is packaged in a posture in which suction is possible using the suction nozzle 362, and the like are possible.

The component receiving section of the automated assembly apparatus may be equivalent to the component carrier which is at the component delivery position. In this case, the automated assembly apparatus is included an object (movable object or fixed object) which is equivalent to the component carrier on which is at the component delivery position, and the component supply system includes only a portion in which the components on the component support surface of the component delivery device are picked up one at a time using a component holding tool.

In the component delivery device, the shuttle device is omitted, and in place of the component carrier, a component accommodation member may be provided which positionally aligns and accommodates a plurality of components at a fixed position equivalent to the component carrier.

The feature in which the component, which is accommodated in the component feeder, is a component which is provided with a protruding section that protrudes from one surface and is to be inserted in a concave section of an assembly target member, and an imaging and holding control section determines the component, which is isolated from another component in a posture in which the protruding section extends in a direction parallel to the component support surface on the component support surface, to be the holding target component, is particularly advantageous when the feature is adopted in combination with a feature in which the component delivery device includes the holding tool rotating device and the holding tool pivoting device. However, the disclosure is not limited to this configuration. For example, if the mounting device of the automated assembly apparatus includes the holding tool rotating device and the holding tool pivoting device, even if the component delivery device of the component supply system according to the present disclosure does not include the holding tool rotating device and the holding tool pivoting device, it is possible to adopt a characteristic in which the holding target component as above is determined.

It is not necessary to perform imaging of the component support surface prior to holding every time the component holding tool holds the component, and may be performed only once on one component support surface.

In addition, the component is not limited to a component which is provided with the protruding section which is to be inserted in the concave section of the assembly target member, but may be a component in which the protruding section is not provided.

The component feeder may have only the component accommodation section. For example, the inclined surface 106 on the rear side of the component feeder 82 is an inclined surface which extends to a front end of the component feeder, the lower end section of the inclined surface is set as the component discharge section and the component on the component support surface is discharged.

The entirety of the upper surface of the component support member may be the component support surface. In this case, according to need, the imaging device moving device moves the imaging device in the lateral direction and the front and back direction.

Each characteristic of the component supply system according to the present disclosure, for example, each characteristic below is able to be adopted independently from other characteristics. That is, (1) the control device includes the imaging and holding control section which causes the imaging device to image in a state in which the component support surface is maintained in a stationary state, and causes the component delivery device to hold the holding target component using the component holding tool; (2) the imaging device is disposed above the component support surface at a posture at which the imaging device faces the component support surface, and the component delivery device includes the holding tool moving device which moves the component holding tool to the function position at which the component holding tool is able to hold the component on the component support surface and the retraction position which is retreated from the function position, in a height space between the imaging device and the component support surface; (3) the component supply system includes a plurality of the component feeders and a plurality of the component support surfaces, in which a plurality of the component feeders and a plurality of the component support surfaces are disposed to line up in a lateral direction, and the imaging device moving device which moves the imaging device in the lateral direction to selectively face each of a plurality of the component support surfaces; (4) the imaging device moving device does not move the imaging device in the front and back direction, and the imaging device images a plurality of the components on the component support surface in each of a plurality of the imaging positions at which the imaging device faces each of a plurality of the component support surfaces; (5) the component dispersed state realization device includes the component support member, the relative moving device which relatively moves the component support member and the component feeder in a direction parallel to the component support surface, and the container vibration device; (6) the component delivery device includes the holding tool moving device and the component carrier; (7) the component delivery device includes the holding tool rotating device and the holding tool pivoting device; (8) the component supply system includes the component return device; (9) the component supply system includes a hand placement component support member; and the like.

The component supply system according to the present disclosure can be adopted in an electronic circuit component mounting machine which is modularized in a manner described in JP-A-2004-104075 and a plurality of which are lined up in a row to configure an electronic circuit component mounting system.

REFERENCE SIGNS LIST

18: COMPONENT SUPPLY SYSTEM, 20: COMPONENT MOUNTING DEVICE, 82: COMPONENT FEEDER, 84: COMPONENT DISPERSED STATE REALIZATION DEVICE, 86: COMPONENT DELIVERY DEVICE, 88: COMPONENT RETURN DEVICE, 90: IMAGING DEVICE, 154: FEEDER VIBRATION DEVICE, 198: COMPONENT SUPPORT SURFACE, 220: COMPONENT COLLECTING CONTAINER, 364: NOZZLE ROTATION DEVICE, 366: NOZZLE PIVOTING DEVICE, 450, 452: COMPONENT CARRIER

The invention claimed is:

1. A component supply system which supplies components in a bulk state to a component receiving section of an automated assembly apparatus in a predetermined posture, the system comprising:
   a component feeder which accommodates a plurality of components in the bulk state in a random posture, and supplies the accommodated components;
   a component dispersed state realization device which realizes a state where a plurality of the components within the component feeder are dispersed on a flat component support surface of a component support member;
   a component delivery device which picks up the components on the component support surface one at a time using a component holding tool and delivers the components to the component receiving section;
   an imaging device which images a plurality of the components which are dispersed on the component support surface; and
   a control device which controls the component supply system,
   wherein the control device includes an imaging and holding control section which causes the imaging device to perform the imaging and causes the component holding tool to hold the components in a state in which the component support surface is maintained in a stationary state, in such a manner that the component holding tool holds a component in a state that is appropriate for holding by the component holding tool as a holding target component from among a plurality of the components which are dispersed on the component support surface based on the result of imaging by the imaging device,
   wherein the component dispersed state realization device includes the component support member which is provided with the component support surface, and a relative moving device which relatively moves the component support member and the component feeder in a direction parallel to the component support surface so that different portions of the component support surface sequentially correspond to a component discharging section of the component feeder.

2. The component supply system according to claim 1, wherein the imaging device is disposed above the component support surface at a posture at which the imaging device faces the component support surface, and
the component delivery device includes a holding tool moving device which moves the component holding tool to a function position at which the component holding tool is able to hold the component on the component support surface and a retraction position to which the component holding tool is retreated from the function position, within a range between the imaging device and the component support surface in a height direction.

3. The component supply system according to claim 1, wherein the component dispersed state realization device further includes a feeder vibration device which vibrates the component feeder during the relative movement of the component support member and the component feeder by the relative moving device to discharge the components from the component discharge section onto the component support surface.

4. The component supply system according to claim 1, wherein the component delivery device includes:
   a holding tool rotating device which is able to rotate the component holding tool at an arbitrary angle about a rotation axis line orthogonal to the component support surface, and
   a holding tool pivoting device which is able to pivot the component holding tool about a pivot axis line orthogonal to the rotation axis line, and
the component delivery device rotates about the rotation axis line and pivots about the pivot axis line a component which is picked up from the component support surface by the component holding tool.

5. The component supply system according to claim 1, wherein the component which is accommodated in the component feeder is a component which is provided with a protruding section that protrudes from one surface and is to be inserted into a concave section of an assembly target member, and
the imaging and bolding control section determines a component on the component support surface which is isolated from other components with the protruding section extending in a direction parallel to the component support surface as a holding target component.

6. The component supply system according to claim 1, wherein the component delivery device includes
   a holding tool moving device which moves the component holding tool in a first direction and a second direction which are orthogonal to each other and are parallel to the component support surface and in a third direction which is orthogonal to the component support surface, and
   a component carrier which moves between a component receiving position close to the holding tool moving device and a component delivery position close to the component receiving section along a direction substantially parallel to the component support surface, and in a state in which the component carrier is positioned at the component receiving position, the holding tool moving device causes the component holding tool to cause the component carrier to receive a component, and the component carrier transports the received component to the component delivery position.

7. The component supply system according to claim 6, wherein a plurality of the component carriers are provided, and a plurality of the carriers are movable independently from each other between the component receiving position and the component delivery position.

8. The component supply system according to claim 6, wherein a component receiving section of the component carrier includes a component receiving recess section which receives a component, which is provided with a protruding section that protrudes from one surface and is to be inserted into a concave section of an assembly target member, with the protruding section oriented downward.

9. The component supply system according to claim 1, further comprising:

a component return device which returns to the component feeder a component which remains on the component support surface not being determined as the holding target component by the imaging and holding control section out of the components which are supported on the component support surface.

10. A component supply system which supplies components in a bulk state to a component receiving section of an automated assembly apparatus in a predetermined posture, the system comprising:

a component feeder which accommodates a plurality of components in the bulk state in a random posture, and supplies the accommodated components;

a component dispersed state realization device which realizes a state where a plurality of the components within the component feeder are dispersed on a flat component support surface of a component support member;

a component delivery device which picks up the components on the component support surface one at a time using a component holding tool and delivers the components to the component receiving section;

an imaging device which images a plurality of the components which are dispersed on the component support surface; and a control device which controls the component supply system, wherein the control device includes an imaging and holding control section which causes the imaging device to perform the imaging and causes the component holding tool to hold the components in a state in which the component support surface is maintained in a stationary state, in such a manner that the component holding tool holds a component in a state that is appropriate for holding by the component holding tool as a holding target component from among a plurality of the components which are dispersed on the component support surface based on the result of imaging by the imaging device, wherein the component supply system comprises a plurality of the component feeders and a plurality of the component support surfaces, wherein a plurality of the component feeders and a plurality of the component support surfaces are respectively disposed to line up in a lateral direction orthogonal to a front and back direction which is a separation direction of the component feeders and the component receiving section, and the component supply system further comprises an imaging device moving device which moves the imaging device in the lateral direction so that the imaging device selectively faces each of a plurality of the component support surfaces.

11. The component supply system according to claim 10, wherein the imaging device moving device does not move the imaging device in the front and back direction, and the imaging device images a plurality of the components on the component support surface in each of a plurality of imaging positions at which the imaging device faces each of a plurality of the component support surfaces.

* * * * *